US008901928B2

(12) United States Patent
Alexiuk et al.

(10) Patent No.: US 8,901,928 B2
(45) Date of Patent: Dec. 2, 2014

(54) MRI SAFETY SYSTEM

(75) Inventors: Mark Alexiuk, Winnipeg (CA); Mehran Fallah-Rad, Winnipeg (CA); Gordon Scarth, Winnipeg (CA); Stephen G. Hushek, Wauwatosa, WI (US); Kirk Maurice Champagne, Winnipeg (CA); Timothy James Hoeppner, Winnipeg (CA); David John Robert Weber, Winnipeg (CA)

(73) Assignee: Imris Inc., Winnipeg, MB (CA)

( * ) Notice: Subject to any disclaimer, the term of this patent is extended or adjusted under 35 U.S.C. 154(b) by 925 days.

(21) Appl. No.: 12/942,522

(22) Filed: Nov. 9, 2010

(65) Prior Publication Data

US 2012/0112747 A1    May 10, 2012

(51) Int. Cl.
  *G01R 33/24*    (2006.01)
  *G01R 33/28*    (2006.01)
(52) U.S. Cl.
  CPC ............................. *G01R 33/288* (2013.01)
  USPC .............................................. 324/318; 324/319
(58) Field of Classification Search
  USPC ......................... 324/300–322; 600/407–435;
              382/128–133; 5/601; 604/95.03;
              606/32
  See application file for complete search history.

(56) References Cited

U.S. PATENT DOCUMENTS

| | | | | |
|---|---|---|---|---|
| 2,912,641 A * | 11/1959 | Ruble | ............................. | 324/303 |
| 3,030,556 A * | 4/1962 | Watson | ........................... | 335/298 |
| 7,082,325 B2 * | 7/2006 | Hashimshony et al. | ....... | 600/411 |
| 7,113,092 B2 | 9/2006 | Keene | ........................... | 340/551 |
| 7,414,400 B2 | 8/2008 | Hoult | ............................. | 324/260 |
| 7,489,128 B2 | 2/2009 | Kopp | ............................. | 324/227 |
| 7,603,161 B2 * | 10/2009 | Wurmfeld et al. | ............ | 600/424 |
| 7,835,785 B2 * | 11/2010 | Scully et al. | ................... | 600/424 |
| 8,073,524 B2 * | 12/2011 | Saunders et al. | .............. | 600/410 |
| 8,190,235 B2 * | 5/2012 | Scarth et al. | ................... | 600/415 |
| 8,245,335 B2 * | 8/2012 | Shvartsberg et al. | .............. | 5/601 |
| 8,442,617 B2 * | 5/2013 | Scarth et al. | ................... | 600/415 |
| 8,652,031 B2 * | 2/2014 | Kirschenman | ................. | 600/152 |
| 2005/0021019 A1 * | 1/2005 | Hashimshony et al. | ......... | 606/32 |
| 2007/0078334 A1 * | 4/2007 | Scully et al. | ................... | 600/424 |
| 2007/0132581 A1 | 6/2007 | Molyneaux | .................... | 340/551 |
| 2007/0167742 A1 * | 7/2007 | Wurmfeld et al. | ............ | 600/424 |
| 2009/0124884 A1 * | 5/2009 | Saunders et al. | .............. | 600/410 |
| 2009/0306494 A1 * | 12/2009 | Scarth et al. | ................... | 600/411 |
| 2009/0318799 A1 * | 12/2009 | Wurmfeld et al. | ............ | 600/424 |
| 2010/0232649 A1 * | 9/2010 | Deng et al. | ..................... | 382/103 |
| 2012/0112747 A1 * | 5/2012 | Alexiuk et al. | ................ | 324/318 |
| 2012/0136239 A1 * | 5/2012 | Scarth et al. | ................... | 600/411 |
| 2013/0172812 A1 * | 7/2013 | Kirschenman | ............. | 604/95.03 |

* cited by examiner

*Primary Examiner* — Arleen M Vazquez
*Assistant Examiner* — Tiffany Fetzner
(74) *Attorney, Agent, or Firm* — Adrian D. Battison; Ade & Company Inc.

(57) ABSTRACT

In a MRI system housed within a room there is provided a movable magnet and additional components for other procedures on the patient, a control system is provided for the relative movement of the magnet and components. This includes a plurality of magnetic field sensors mounted on the components for measuring the magnetic field at the location of the component and an optional camera positioning system so that the control system can estimate relative positions of the components relative to the magnet from the sensed field strengths from the set of sensors to avoid collisions during the movements.

19 Claims, 9 Drawing Sheets

MRI SAFETY SYSTEM

This invention relates to a safety control system in an apparatus for carrying out medical procedures on a patient where some of the components are movable.

This system has applications in for use in operating rooms equipped with a high field intra-operative movable MRI scanner.

BACKGROUND OF THE INVENTION

Recent innovations in Magnetic Resonance Imaging (MRI) technology has allowed IMRIS to develop new inter-operative imaging techniques which allow a patient to be imaged while undergoing surgery in an operating room. This is done by bringing an MRI system into the operating room along ceiling mounted rails at a rate of up to 6.4 cm/second. The technology has the advantage of giving surgeons immediate feedback for an ongoing operation which they did not previously have access to. However, this beneficial new technology creates potential hazards which do not exist in traditional MRI systems. These hazards are due to the fact that MRI employs extremely strong magnetic fields of up to 3 tesla in a clinical setting; more than enough to turn a ferromagnetic object into a dangerous projectile.

MRI is typically performed in a designated diagnosis room with a strict procedure in place to prevent any ferromagnetic object from entering the room. Surgery being performed in an operating room often requires ferromagnetic objects which may become hazardous once an MRI system enters the room. The current method of preventing an accident uses a checklist containing all items which need to be brought outside of either the 5 or 50 gauss line, depending on the object. A gauss line is a region painted on the floor of an operating room indicating safe zones where the magnetic field will be below 5 or 50 gauss. This current system is vulnerable to human error and does not monitor the source of the hazard, the presence of a strong magnetic field.

Magnetic Resonance Imaging or MRI is a form of medical imaging involving the use of an extremely powerful magnetic field. The magnetic flux density can be up to 3 tesla or 30 000 gauss in a clinical setting. The tesla is the SI unit of magnetic flux density or magnetic field. The gauss is a non-SI unit of magnetic field and is more commonly used to describe the strength of a magnetic field by those working with MRIs; one tesla is equal to ten thousand gauss. The theory of how the actual MRI works is not the focus of this report although a brief summary follows. MRI creates a strong magnetic field within the imaging suite using a large superconducting magnetic. It should also be understood that the magnet does not have the capability of being turned off and on easily and therefore the magnet is assumed to be always on. Although the physical size of the magnet varies by model, a common outer diameter is approximately 1.9 meters with a bore of 0.7 m in diameter. When a patient is placed in the bore or center of this magnet, the magnetic field will align the spin of the body's protons in either a parallel or anti-parallel direction with reference to the magnetic field. An RF pulse at 63.65 MHz for a 1.5 T system or 123.2 MHz for a 3 T system is then sent into the body to flip the spin of the protons off of the magnetic field axis and into another axis dependent on the power of the RF pulse. The protons which are flipped are now forced back into alignment with the magnetic field in a rotating motion similar to a spinning top. The process of the protons spin being realigned with the magnetic field creates a small decaying RF pulse which is picked up by a receive coil. The coil then sends the data back to a computer which does a 2-dimensional Fourier transform, creating the magnetic resonance image.

High field intra-operative MRI is becoming established in neurosurgery to capture surgical target displacement as a result of brain-shift and for post-operative residual tumor identification. One suite design employs a movable MRI scanner that can enter the operating room (OR) on overhead rails. This level of integration has the benefit of eliminating patient movement between pre-operative and post-operative imaging but entails other operational constraints. For example, preparatory pre-imaging steps are added to the clinical workflow, including draping the patient to maintain sterility at the surgical site. Surgical staff use paper and/or computer-based checklists to ensure that the MR imaging environment is RF-quiet and that appropriate safety pre-cautions are taken. Safety-related activities include moving MR-conditional and MR-unsafe, e.g. ferromagnetic, equipment to the exclusion zone bounded by the 5 gauss field line. Equipment moved may include boom-mounted surgical lights and monitors, anaesthesia machines, patient monitors, carts and navigation systems.

Monitoring equipment and tools within an MRI-integrated OR relies largely on proper training and minute-to-minute vigilance of the OR staff. It is clearly advantageous to mount magnetic field sensors on equipment to create a secondary and automatic means to monitor safety hazards in this environment. However, existing audible magnetic field sensors are fairly large in size and cannot be easily mounted to third party equipment. Furthermore, these sensors work individually using local audio alarm, are designed for larger structures and provide a limited number of alarm thresholds. In summary, to date there has been a lack of integration between computer-based checklists, room control systems and miniaturized distributed magnetic field sensors.

When a movable MRI scanner is used intra-operatively, there are safety concerns and impacts to the existing workflow. That is the scanner introduces a high magnetic field to the operating room. Materials that are attracted to magnets (ferromagnetic) may become projectiles causing injury or death to the patient, to hospital staff or to the surgeons.

As a result of the safety concerns, hospitals have introduced protocols that must be followed before the MRI scanner enters the room. The protocols include counting and moving ferromagnetic instruments from the center of the OR to a zone that experiences less than 5G of magnetic field, moving light and camera-booms to the 5G safety zone and moving other objects outside of the room or to the 5G safety zone.

In some instances objects may be tethered before the scanner enters the room. When imaging is completed, the instruments, booms and other objects are moved back into their position for surgical use.

The OR can be a high stress environment so that, despite training and practice, some tasks required for safety may be omitted at some times.

In practice, commercial MRI safety systems exist, for example from MedNovus and Kopp Development, which are generally large, fixed-position ferromagnetic detectors that act as a portal into the room. Persons with ferromagnetic materials on or in their person act to trigger an alarm as they enter. This is the current state of the art.

For example, in U.S. Pat. No. 7,489,128 (Kopp) issued Feb. 10, 2009 is disclosed a protection arrangement for association with an operable MRI apparatus located within a room that has an access opening, the MRI apparatus providing a residual magnetic field that extends to a location of the opening, the arrangement including: a detector for passively monitoring the residual magnetic field at the location of the opening, the detector includes an array of passive magnetic field sensors arranged about the periphery of the opening in a spaced arrangement such that each sensor is associated with a different portion of the access opening, the field changing in response to a presence of ferrous material at the opening, each of the sensors including means for outputting a signal indicative of the ferrous material responsive change in the magnetic field at the associated portion of the access opening; and means for receiving the change indicative signals, for determining whether the change indicated by at least one of the change indicative signals exceeds a limit and for providing a safety response that addresses the condition of ferrous material at the opening of the room within which the MRI apparatus is located upon determination of at least one threshold being exceeded.

A system similar to the MedNovus and Kopp systems has been developed by David Hoult of National Research Council Canada and is disclosed in U.S. Pat. No. 7,414,400 issued Aug. 19, 2008.

US Published Application 2007/0132581 (Molyneaux) published Jun. 14, 2007 discloses a system for ferrous object and/or magnetic field detection which detects a given magnetic field strength around a MRI machine and alert users to the field's presence. The magnetic field warning system can rely on a single badge that warns its user. The badge utilizes an RFID system which can turn the badge on when it enters the MRI room and off when it leaves the MRI room. The badge is worn by a person, located on or near a ferrous object, embedded in clothing, or located in other positions convenient to a user. The detector, the power supply and the user interface are utilized in a single package providing a badge type concept. This is now issued as U.S. Pat. No. 7,696,751 issued Apr. 13, 2010.

U.S. Pat. No. 7,113,092 (Keene) issued Sep. 26, 2006 discloses an apparatus for detecting ferromagnetic objects in the vicinity of a magnetic resonance imaging scanner. The apparatus comprises primary sensors adapted to measure a magnetic field, arranged in communication with a signal processor configured to identify temporal variations in the measured magnetic field due to the movement of a ferromagnetic object within an ambient magnetic field and to provide an output indicative of the presence of a ferromagnetic object in the vicinity of the primary sensor. The apparatus further comprises secondary, non-magnetic, sensors adapted to detect the movement of objects in the vicinity of the primary sensors in order to reduce false alarms. The output from the signal processor may be used to operate an audible alarm, a visual alarm, an automatic door lock or a physical barrier.

SUMMARY OF THE INVENTION

It is one object of the invention to provide an apparatus for carrying out medical procedures on patients which includes MRI where the safety of the system is improved in relation to the dangers introduced by the presence of the high field magnet.

According to a first aspect of the invention there is provided an apparatus for carrying out medical procedures on a patient comprising:

a magnetic resonance imaging apparatus including a magnet for generating a magnetic field of sufficient intensity to carry out a magnetic resonance imaging procedure on the patient;

a plurality of additional components for use in carrying out at least one additional procedure on the patient;

wherein the field of the magnet extends to an area outside of the magnet with sufficient intensity to cause movement of ferro-magnetic material within the area;

the magnet and/or the plurality of additional components being mounted for relative movement such that the magnetic resonance imaging procedure is carried out with the plurality of additional components in a remote location from the magnet and the at least one additional procedure is carried out with the magnet in a remote location from the plurality of additional components;

a control system for controlling the relative movement of the magnet and the plurality of additional components;

a plurality of magnetic field sensors each mounted on a respective one of the plurality of additional components for measuring the magnetic field at the location of the component;

the magnetic field sensors being arranged for communication of signals to the control system;

the control system being arranged to change operation of the relative movement of the magnet and/or the components in response to receipt of a signal from one or more of the sensors.

Preferably each sensor measures the magnetic field strength in three perpendicular dimensions.

Preferably the magnetic field sensors are mounted on mobile and stationary objects such as booms, a surgical table, microscopes, instrument trays, kick buckets, foot pedals.

Preferably the magnetic field sensors communicate by wireless communication from the sensors to the control system.

Preferably the control system includes an audio/visual display.

Preferably the control system includes a real-time asset tracking system for the components.

Preferably the control system is arranged to initiate movement of components from a potentially unsafe position to a pre-defined safe-position.

Preferably the control system includes object avoidance mechanisms in order to avoid collision with persons and other objects in the room.

Preferably the control system is arranged to estimate position of the magnet from the sensed field strengths from the set of sensors.

Preferably the control system is arranged to use information on the estimated position of the magnet to anticipate collisions and initiate avoidance mechanisms.

Preferably the control system is arranged to include a known position of the sensor on the object and a physical model of the object extension so as to provide a decision based on the current orientation of the object and the sensed field strength.

Preferably there are provided objects in the area which do not have magnetic field sensors attached to them but have positions communicated to the control system.

Preferably the objects are fixed.

Preferably the objects have their position measured or inferred by other means, such as a camera system.

Preferably the control system is arranged to achieve an optimal configuration of the components for imaging.

Preferably the control system is arranged to shut off RF noisy equipment before imaging.

According to a second aspect of the invention there is provided an apparatus for carrying out medical procedures on a patient comprising:

a magnetic resonance imaging apparatus including a magnet for generating a magnetic field of sufficient intensity to carry out a magnetic resonance imaging procedure on the patient;

a plurality of additional components for use in carrying out at least one additional procedure on the patient;

wherein the field of the magnet extends to an area outside of the magnet with sufficient intensity to cause movement of ferro-magnetic material within the area;

the magnet being mounted for movement relative to the patient from a first position for the magnetic resonance imaging procedure on the patient to a second remote position for carrying out the additional procedure on the patient;

a control system for controlling the movement of the magnet;

and a plurality of magnetic field sensors each mounted on a respective one of the plurality of additional components for measuring the magnetic field at the location of the component;

the magnetic field sensors being arranged, for communication of signals to the control system.

Preferably the control system is arranged to stop movement of the magnet.

According to a third aspect of the invention there is provided an for carrying out medical procedures on a patient comprising:

a magnetic resonance imaging apparatus including a magnet for generating a magnetic field of sufficient intensity to carry out a magnetic resonance imaging procedure on the patient;

a plurality of additional components for use in carrying out at least one additional procedure on the patient;

wherein the field of the magnet extends to an area outside of the magnet with sufficient intensity to cause movement of ferro-magnetic material within the area;

the magnet and/or the plurality of additional components being mounted for relative movement such that the magnetic resonance imaging procedure is carried out with the plurality of additional components in a remote location from the magnet and the at least one additional procedure is carried out with the magnet in a remote location from the plurality of additional components;

a control system for controlling the relative movement of the magnet and the plurality of additional components;

a plurality of magnetic field sensors each mounted on a respective one of the plurality of additional components for measuring the magnetic field at the location of the component;

the magnetic field sensors being arranged for communication of signals to the control system;

wherein the control system is arranged to estimate relative positions of the components relative to the magnet from the sensed field strengths from the set of sensors.

The arrangement described herein consists of a series of magnetic field sensors which are rigidly fixed to ferromagnetic objects in the OR. Many sensors can be deployed in the OR. Each sensor measures the magnetic field strength in 3 perpendicular dimensions. The system collects the measured field strength from each sensor several times a second. When the field strength of any sensor exceeds a threshold $T_1$ (say 5G), the system issues an alert. A second type of alert is issued when the field strength of any sensor exceeds a threshold $T_2$ (say 50G). The alerts are configurable and may consist of an audible noise of a certain frequency, a flashing light in the room and/or the disabling of magnet movement.

The system acts as an automatic warning system that complements the existing safety protocols.

The system will perform the following:

a) Distributed sensing of magnetic fields on mobile and stationary objects such as booms, the surgical table, microscopes, instrument trays, kick buckets, foot pedals, etc.

b) Wireless communication from the sensors to the basestation or central controller.

c) Enable the sensors to go to a sleep-mode during imaging and/or during surgery.

d) Use a wake-up call to change the mode of the sensors from sleep to measurement and vice versa.

e) Communicate the data outside of the OR room to the central computer or processing unit.

f) Integrate the system with the magnet mover, or an audio/visual display, or a real-time asset tracking system (for example one that uses RFIDs)

g) Initiate a control message to the magnet mover controller in order to stop movement of the magnet h) Initiate movement of booms from a potentially unsafe position to a pre-defined safe-position. Movement of the booms will employ object avoidance mechanisms in order to avoid collision with persons and other objects in the room.

j) Estimate position of the magnet from the sensed (measured) field strengths from a set of sensors.

k) Use information on the estimated position of the magnet to anticipate collisions and initiate avoidance mechanisms.

l) This system can be used with objects that have had sensors attached to them. Given the known position of the sensor on the object and a physical model of the object extension, a decision will be based on the current orientation of the object and the sensed field strength.

m) This system can be used with objects that have not had sensors attached to them but have known positions, that is they are fixed, or their position is measured or inferred by other means such as a camera system.

The system described herein has the following possible features and advantages:

a) The system operates to provide improved consideration of the surgical workflow for intra-operative imaging (equipment repositioned to the safety zone) and enhancing safety by providing integrated control of the RF doors, magnet mover, and booms.

b) The use of measured magnetic field values provides an input into a control system. This feedback is used to change object position and operating mode in order to optimize workflow and enhance safety.

c) Control of object position to achieve the required configuration for imaging (eg automatically moving the booms to the safety zone)

d) Control of object status (operating mode) to achieve an optimal configuration for imaging (eg shutting off "RF noisy" equipment just before imaging) and automatically returning objects to a status for surgery/intervention as soon as the imaging is complete (eg automatically turning on the X-ray flat panel detectors on after imaging has been completed).

c) Inference of the magnet position from distributed field sensors.

d) Use of field sensors and known geometry of the monitored object to infer possible collisions and trigger collision avoidance mechanisms and control.

e) Data on the position and use of the instruments, magnet, table etc can be analyzed for workflow efficiencies in the surgical therapy. This data can also be used to estimate preventive maintenance for components that wear out over movement distances.

The system can be used for intra-operative imaging, for example, to obtain updated images after brain-shift.

Another specific use is in obtaining post-operative images, for example that determine whether residual tumor exists or to determine whether patient deficit has occurred during the procedure.

While the system is primarily designed for use with the IMRIS movable magnet arrangement, the same system can be used with a fixed magnet and moving objects or components. The above system is still relevant to increasing safety in the room in that the distributed sensors provide information of the magnetic field for the moving objects. As interventions start to be practiced in diagnostic settings, the magnet will be stationary but new types of equipment will start to be used in a high magnetic field. An example of such equipment is anaesthesia machines. In this situation, it would be advantageous to have one or more sensors on such equipment. When the equipment is moved toward a potentially dangerous area of higher magnetic field, a safety mechanism locks the wheels of the equipment or triggers an alarm.

This invention is typically used with the movable MRI scanner and deployed in ORs at all if its sites. It is preferably integrated with the matrix information management system (audio/visual routing) and the magnet mover controller.

Other systems seem to be focused on card-based sensors worn by personnel or on large fixed position ferromagnetic detectors which are not interconnected to a single integrated control system which can control device positions and operating modes.

The invention has benefit in terms of the integration of controlled devices with respect to safety requirements for intra-operative imaging The invention is the simplest solution in that it encapsulates a'variety of controlled devices, their current relationship (position) with respect to the MRI scanner, and a set of rules that enhance safety.

The system preferably uses a wireless communication system since implementing a tethered (wired) system would be inconvenient for installers and users. Installers would have to run cables through the booms. Wired sensors on other objects may lead to wires on the floor creating a hazard.

The system using the central controller avoids having to rely on manual control of related systems is inconvenient to the user and introduces the possibility of manual error. For example, a competing system could require that as the field values change, the user manually opens the RF door which is less convenient.

The arrangement therefore provides a new magnetic field monitoring system that monitors potential safety hazards via a wireless sensor network. This systems provides an output signal for a central alarm and has configurable alarm thresholds. Use of such a system supplements existing practices and enables further enhancement to room control systems to accommodate custom workflows.

The sensor network consists of a PC interface, a base station and multiple sensor nodes. A sensor evaluation board is used to compare measurement performance of giant magneto-resistive (GMR) sensors to Hall effect sensors. Hall effect sensors are selected based on lower current draw (sleep and active modes) and larger measurement range. This design is implemented on a custom printed circuit board. Main sensor components include: power supply, Hall effect sensors, anti-aliasing filters, microcontroller (PIC18F, Microchip) and RF module (MRF24J40MA, Microchip). In monitoring mode, the microcontroller queries the Hall effect sensors sequentially. The magnetic field magnitude is compared to software-set thresholds (5G, 50G) that represent alarm conditions. The RF module uses the IEEE 802.15.4 based MiWi P2P protocol operating in the 2.4 GHz ISM band. The protocol is suitable for low-power and low-data rate applications. A further design effort reduced the size of the sensor nodes. Both bench and lab testing are performed. The lab tests are performed on a movable 1.5T Siemens Espree scanner (IMRIS, Winnipeg). Tests included: communication in a reflective environment, communication range, round-trip communication latency, communication rate, network collision frequency, node wake up time, and alarm conditions. A standard Siemens RF noise test (with phantom) is also conducted with the system in operation.

Testing revealed that magnetic field measurements of the sensor system are in agreement with a magnetometer (average 1.71G; std dev 0.75G; range −3G to 2G). The Siemens RF test showed an elevated baseline signal intensity but no image artifacts. A magnetic field saturation test showed that the Hall effect sensors and device continued to operate normally after being placed at scanner isocentre for a brief period.

In the suite under consideration, proposed system use is as follows: sensors are deployed on booms and equipment and their configuration recorded along with unique sensor IDs. Sensors register with the base station and go into sleep mode. The base station is connected to a central room control system which includes displays and audio alarms. Preparation for intra-operative imaging occurs normally. Sensor activation is triggered by opening the RF-shielded doors. As the MRI scanner moves into the OR to the imaging position, sensors continuously monitor local magnetic field strength. Sensor communication to the base station includes node heart-beats and alarm conditions. On receipt of an alarm condition, the location of the sensor is displayed based on the configuration look-up table. Further room control actions are also possible.

The arrangement provides a wireless sensor network to monitor potential hazards in an intra-operative imaging workflow through software-based thresholds and an integrated room control. This novel sensor system provides a critical added layer of hazard detection to manual pre-imaging checklists currently in use.

BRIEF DESCRIPTION OF THE DRAWINGS

One embodiment of the invention will now be described in conjunction with the accompanying drawings in which.

In the drawings like characters of reference indicate corresponding parts in the different figures.

DETAILED DESCRIPTION

Figure 1:
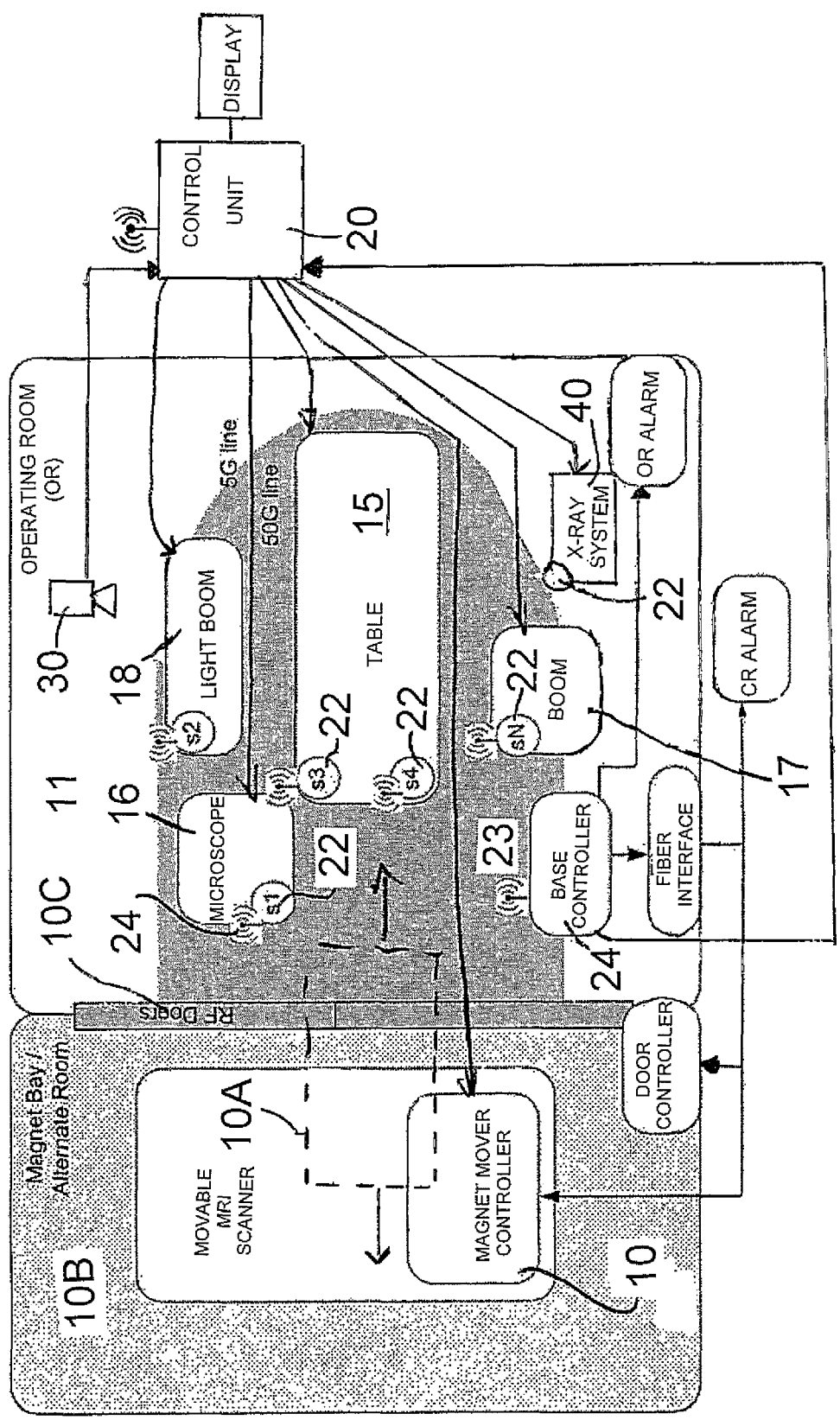
FIG. 1 is a schematic plan view of an operating room for carrying out imaging and other procedures on a patient including a control system according to the present invention.
Figure 2:
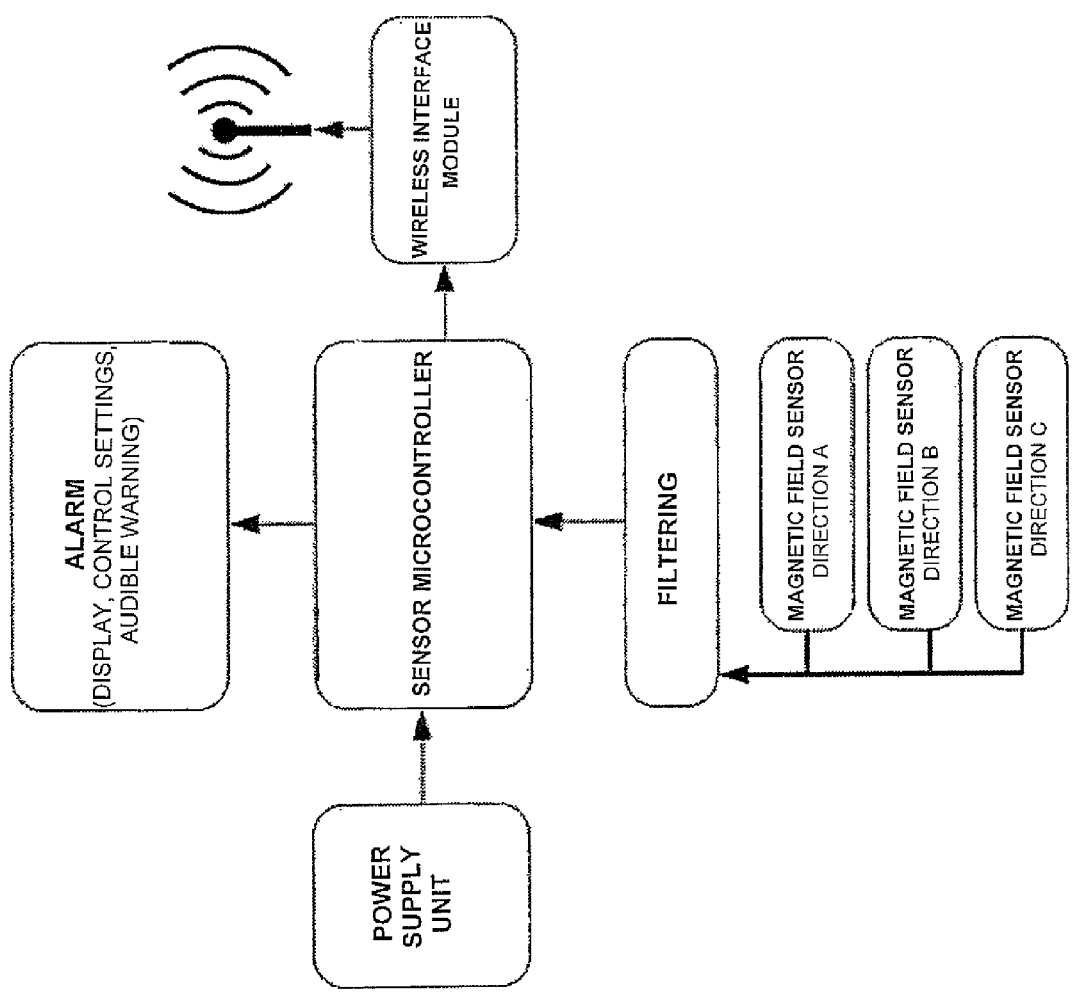
FIG. 2 is a schematic view of a block diagram of a sensor of the system of FIG. 1.
Figure 3:
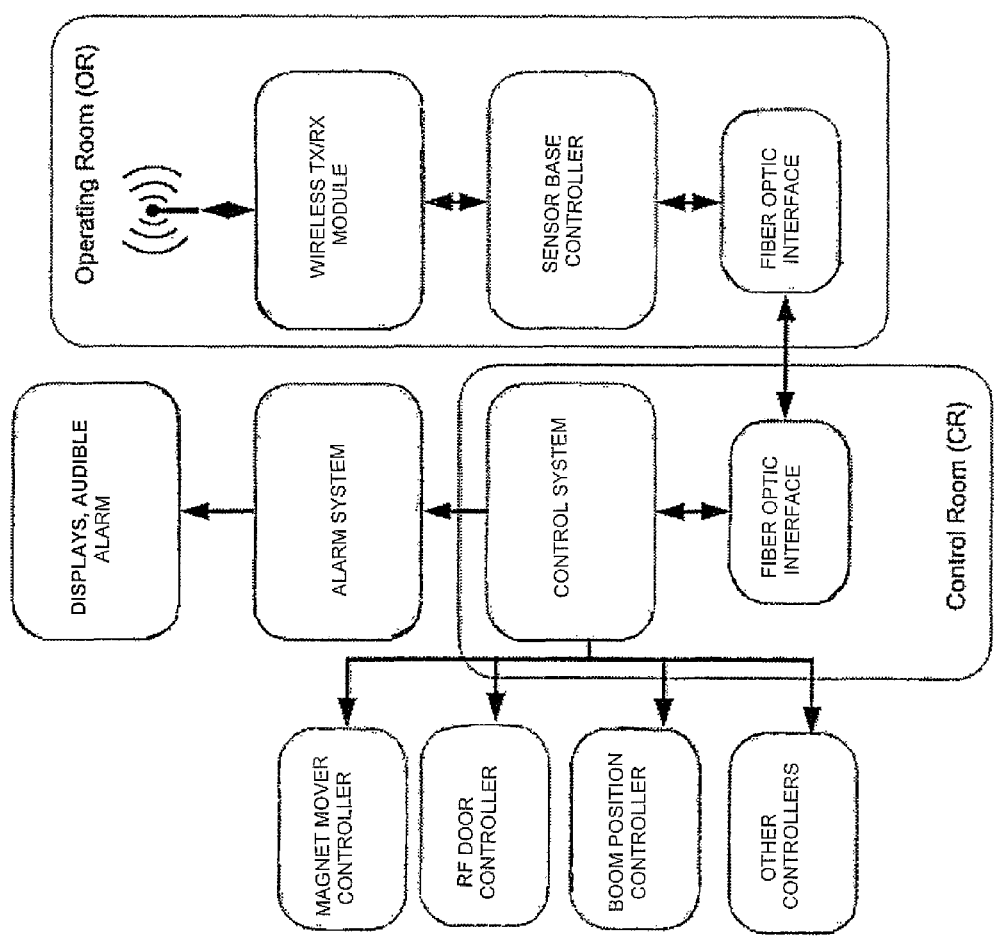
FIG. 3 is a schematic view of typical architecture of the central controller of the system of FIG. 1.

The apparatus for carrying out medical procedures on a patient as used in the present invention includes a magnetic resonance imaging apparatus 10 of a conventional construction well known to persons skilled in this field. The system includes a magnet 10A for generating a magnetic field of sufficient intensity to carry out a magnetic resonance imaging procedure on the patient. This is associated with RF coils and gradient coils together with the control systems for operating these components which are not the subject of the present invention and thus will not be described in detail.

In the arrangement with which the present invention is concerned, the magnet 10A is movable between a magnet bay area 10B and an operating room 11. The room 11 may form one of a suite of rooms arranged around the bay 10B and into which the magnet 10A may move through doors 10C.

The magnet cooperates with a table 15 on which the patient is positioned for the imaging process. The table can be movable to different locations or in an adjustment action.

Further details of a table and a system of imaging are shown in U.S. application Ser. No. 12/333,032, filed Dec. 11, 2008 and in U.S. patent application Ser. No. 12/420,859 filed Apr. 8, 2009, both of which are published in December 2009 as 2009-0306495 and 2009-0306494 respectively, to which reference may be made for further detail, and the disclosures of which is incorporated herein by reference.

As shown and described in the second above application, the apparatus in the operating room can include an X-ray imaging system 40 which is movable between operating and retracted positions so as to carry out X-ray imaging with the magnet retracted.

The room 11 includes a series of separate components which can vary depending on the different procedures to be used and are provided to cooperate with the patient on the table 15. The above references show some components which can be used. As shown, the components include for example a microscope 16, a boom 17 and a light boom 18. Other imaging modalities can be included. These provide a plurality of additional components for use in carrying out at least one additional procedure on the patient. The sensors can be located on mobile and stationary objects such as booms, a surgical table, microscopes, instrument trays, kick buckets and foot pedals.

It is well known that the field of the magnet extends to an area outside of the magnet with sufficient intensity to cause movement of ferro-magnetic material within the area. In a situation where the magnet is stationary, the situation can be controlled by monitoring the introduction of ferro-magnetic material into the room in the manner previously described.

However in this arrangement, the magnet and/or the components are individually movable relative to each other so that there is the danger of collisions and the danger that the component itself or some element on it is brought into the field with the danger of damage or high velocity accelerations.

In the arrangement as shown, the magnet is mounted for relative movement relative to the plurality of additional components. Thus the magnetic resonance imaging procedure is carried out with the plurality of additional components moved to a remote location away from the magnet. When the magnet is retracted to the separate room or location, the additional procedure or procedures are carried out with the magnet in a remote location from the plurality of additional components. In another arrangement the magnet may be stationary and the patient on the bed moved to different locations to co-operate with the different components with the components themselves movable to take up required positions for the procedures.

A control system 20 for controlling the relative movements of the magnet and the plurality of additional components. This control system is typically a part of the complex imaging control assembly necessary for driving the components to the required locations and for effecting the imaging action.

A plurality of magnetic field sensors 22 are provide with each mounted on a respective one of the plurality of additional components for measuring the magnetic field at the location of the component. Further details of the sensors are described hereinafter.

The magnetic field sensors include wireless transmitters 24 arranged for communication with a base receiver unit 23 of the control system so as to communicate a signal related to the value of the field. In one arrangement, in the event that the magnetic field sensed exceeds a predetermined maximum value, a single warning signal is communicated. In an alternative arrangement, each sensor is arranged to communicate an ongoing actual value of the sensed field. Thus the control unit receives in real time a continual feed of the sensed fields in order to control and detect the relative positions of the components to the magnet and to carry out remedial action in the event that a dangerous condition is encountered.

The control system includes a program arranged to change operation of the relative movement in response to receipt of a signal from one or more of the sensors.

As explained in more detail hereinafter, each sensor measures the magnetic field strength in 3 perpendicular dimensions.

The control system includes an audio/visual display to assist in the operator controlling the operation of the movements of the components of the system. The control system provides a real-time tracking system for the components so that their positions relative to the magnet and/or relative to each other can be monitored by the system to warn of impacts or other danger and to take ameliorating action where required. This is also displayed to the operator in a suitable graphics arrangement. In particular, in the event that the magnet is moving and one or more of the other components is determined to be in an unsafe position, the control system is arranged to initiate movement of such components from the potentially unsafe position to a pre-defined safe or retracted position. The monitoring of the positions of the components in the room allows the control system to provide object avoidance systems in order to avoid collision with persons and other objects in the room.

Figure 4:
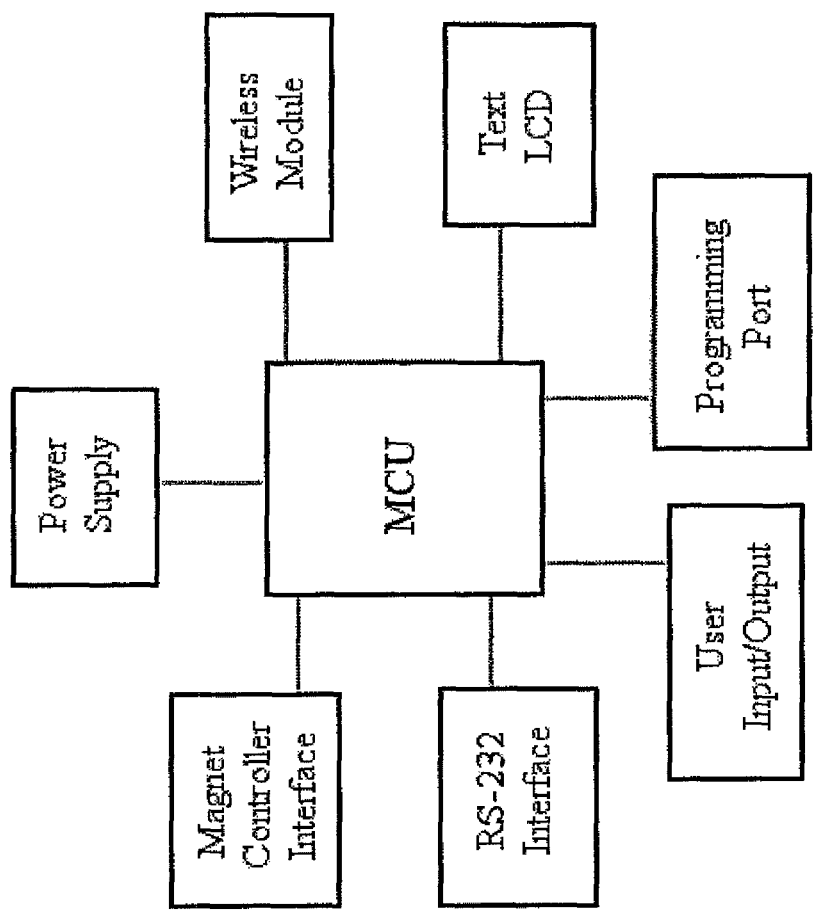
FIG. 4 shows the main components in the Base Station of FIG. 1.
Figure 4A:
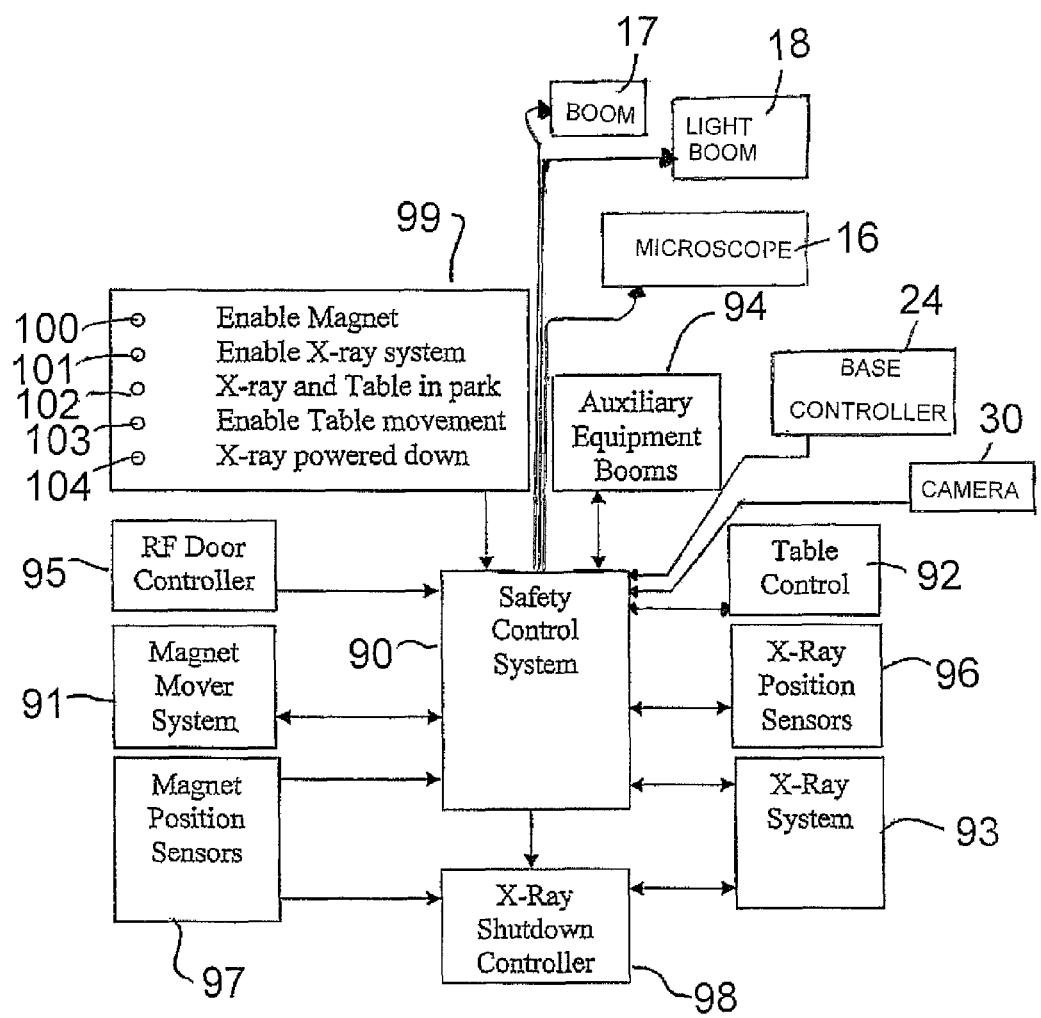
FIG. 4A is a schematic illustration of the control unit of FIG. 1 for controlling the movement and operation of the movable components of FIG. 1.

Turning now to FIG. 4A, there is provided a safety control system 90 for controlling movements and operations of the various components including the magnet. This receives inputs from position sensors and from the magnetic field sensors 22 through the base controller 24.

The movement of the magnet 10 is controlled through a magnet mover system 91, the patient support table 15 through a table control 92 and the X-ray imaging system 40 through as system controller 93. The system 90 also controls the position of booms 17 and 18 and other auxiliary equipment such as monitors through a controller 94. The doors 10C are actuated by a controller 95 operated by the system 90.

The system includes inputs from position sensors 96 for the X-ray system 4 and sensors 97 for the magnet 3. The system 90 also actuates an X-ray shut down controller 98 which activates a shut down mode of the X-ray system. The system also includes a status display 99 which includes, for example, LEDS 100 to 104 which display respectively as follows: 100 magnet movement enabled; 101 X-ray system operation enabled; 102 X-ray and table in park positions; 103 table movement enabled; 104 X-ray system powered down by the shut down controller 98.

The controller 90 receives inputs from the magnetic field sensors via the base controller 24 and from the camera system (if used) to monitor the position of components not otherwise located by position sensors or by field sensors.

The safety control system is programmed with the following functions:

1. The control system is arranged to estimate position of the magnet relative to the other components from the sensed field strengths from the set of sensors. In addition this data can be used to estimate the positions of the components relative to one another. Thus the control system is arranged to use information on the estimated position of the magnet to anticipate collisions and initiate avoidance mechanisms. The control system is arranged to include a known position of the sensor on the component and a physical model of the component extension so as to provide a decision based on the current orientation of the component and the sensed field strength.

2. In order to provide complete control of the movements within the room, other objects in the area which do not have magnetic field sensors attached to them can be modelled into the control system so that they have positions communicated to the control system. Typically such objects are fixed so that the model of the room and its fixed objects can remain as a stationary array relative to the moving components. However some objects which are movable can have their position measured or inferred by other means, such as a camera system 30.

3. In addition to the management of the movements of the components to avoid damage and impact, the control system can also be arranged to achieve an optimal configuration of the components for imaging. That is the required optimal position is pre-determined and the system can ensure that the components are moved to this position using the magnetic field and optional camera detection systems to locate the components. In addition the control system can be arranged to shut off or place into sleep mode RF noisy equipment before imaging.

4. It acts to control movement of the magnet and particularly to prevent forward movement of the magnet into the room in the event that the patient support table and the X-ray imaging system are not in a park position.

5. The underlying concept is that the safety system prevents putting the system in a dangerous state where the X-ray, MR and related and other components such as the booms that contain the monitors are physically moved to positions where they may interact. That is the safety control system is arranged to prevent dangerous configurations of equipment; for example the C-arms of the X-ray system being located in a high magnetic field.

6. The system can be used to actively cause the X-ray system to move into parked position as the magnet comes forward.

7. It acts to operate forward movement of the magnet up to a halt position 3E spaced from the end of the upper patient support portion of the patient support table at which the magnet automatically is halted. At this position the table can be adjusted manually and checked by the operator to ensure that the table is in an accurately required position. Thus minor adjustment of the table to orient the table within the bore can be effected although larger adjustments to a position which would cause impact of the table and magnet can be prevented. Thus the magnet is brought up to the halt position close to but spaced from the table where the final adjustments can be made of the patient, the RF coils can be connected to the terminals provided on the magnet and the table orientation can be finely adjusted. When this is completed, the magnet is moved forwardly to the imaging position.

8. It acts to prevent the patient support table from adjusting the upper patient support portion when the magnet is moved forwardly of the halt position so that movement of the table is fixed and turned off when the magnet is in the magnetic resonance imaging position.

9. It acts to power down the X-ray imaging system through controller 98 sufficiently to reduce RF noise during the MRI by removing power to all components within the room with the exception of those necessary to maintain temperature control of X-ray receptors of the X-ray imaging system.

10. After the imaging is complete, it acts to operate retraction movement of the magnet up to a halt position spaced from the end of the upper patient support portion of the patient support table at which the retraction movement automatically is halted. At this position the patient can be checked and the RF coils can be disconnected from the terminals to ensure that the magnet is free to be removed through the doors 10C.

11. It ensures that the magnet is fully removed and the doors closed before the X-ray equipment can be moved from its park position.

12. It provides a status display for an operator which includes indication of:

Enablement of movement of the magnet;
The X-ray imaging system and patient support table being in park position;
Enablement of movement of the X-ray imaging system;
Enablement of movement of the patient support table;
The X-ray imaging system being powered down to reduce RF noise during the MRI.

Therefore in general, a safety system is provided for the safe and effective integration of the two modalities. There are a number of hazards in the AR, such as: collision with moving stands, table, and MR; ferrous objects being drawn into magnet bore; and unwanted radiation exposure.

The global safety system is responsible for a number of aspects of the system:

Motion of the C-arms is disabled when unsafe to do so.
Motion of the table is disabled when unsafe to do so.
Forward travel of the MR is disabled when unsafe to do so.
The path from the magnet's home position in the DR to its imaging position in the AR is divided into three zones:

Far Zone: the magnet and the C-arms are far enough apart that each may operate independently without safety concern. The patient table may move freely.

Near Zone: the magnet is close enough to the C-arms that the C-arms must be safely parked and not move. The patient table may move freely.

Table Zone: the magnet is over the table, or nearly so. The C-arm stands must be safely parked and not move. The table must be in the correct position for MR imaging and must not move.

In the Near Zone, the C-arm stands must be safely parked and not move. If this is not the case, forward motion of the MR is interrupted, preventing the MR from entering the Near Zone. Similarly, at the transition between the Near and Table Zones the condition that the table must be in the position for MR imaging (i.e. at correct height and lateral position to enter the magnet bore) is checked. If the table is not in the correct position, the magnet may not move forward into the zone.

The ESCP (Equipment Safety Check Point) and PSCP (Patent Safety Check Point) divide the path into three zones: Far, Near, and Table. Interlocks prohibit the magnet from advancing into a zone if it is unsafe to do so.

The safety system controller communicates with the movable magnet controller, the RF door controller, the X-ray equipment and the patient table, as shown in FIG. 1. The signalling includes the following information:

The moveable magnet controller sends the magnet zone and receives a signal indicating whether forward travel is permitted.

The door controller sends a signal indicating whether the door is open or closed.

The X-ray controller sends information on the location of the C-arm stands and table position, and receives signals indicating whether stand motion or table motion is permitted.

The sensor described in more detail hereinafter can be used in a number of different ways:

Use of the magnitude of the measured magnetic fields to compare against a threshold for possible alarm.

Use of one or more of the (x,y,z) measured magnetic field components in order to determine or estimate the relative position between objects or the absolute position of a single object. It is important to note that for estimation of relative positions, it is not assumed that both objects have sensors on them. The position of one of the objects may be defined based on previous information such as a fixed position from an installation or a calibration. In systems where a separate tracking system is involved, such as a stereotactic camera system, the known position of a camera tracked object can be estimated relative to a sensor-tracked object.

Multiple object tracking systems can be used simultaneously or in a complementary manner such that multiple levels of redundancy are created to enhance safety and overcome limitations of individual systems such as:

$$M=\sqrt{M_x^2 M_y^2+M_z^2}$$

The limitation of line-of-sight (LOS) for camera systems

Limits on the number of sensors that can be distributed in the room

It is important to note that information from the sensors (their position and sensed magnetic field values), fixed positions known from design, installation and calibration, and information on object position from other object localization systems (RFIDs, camera tracking) contribute to make decisions about alarms and control. Together this information enhances workflow safety.

Different types of sensor can be used. The Hall Effect is a natural phenomenon where, due to the Lorentz Force, the movement of charge through a conductor exposed to a perpendicular magnetic field will produce an electric potential perpendicular to both the movement of charge and magnetic field. The Hall Effect is often exploited to produce magnetic field sensors where the output voltage is directly proportional to a magnetic field in a single vector direction over a large dynamic range. The following equation describes the Hall Voltage present across a Hall Effect sensing element as a function of current density and magnetic field. This assumed the current and magnetic field are perpendicular. The thickness of the sensing element is denoted by d and n is the charge carrier density.

$$V_H = \frac{IB}{nd}$$

The output voltage across a Hall Effect sensing element may be unacceptably small for certain applications and sensitive to changes in temperature. As a result, many Hall Effect sensors integrate temperature compensation circuitry, filtering and high-gain amplifiers to go along with the Hall Effect sensing element.

Three single-axis Hall Effect sensors may be used in conjunction to measure a magnetic field in three directions. This is the approach this project uses in order to measure the overall scalar magnitude of a near-static magnetic field. In order to measure scalar magnitude each sensor must be oriented such that the sensor's sensing axis is perpendicular to the sensing axes of the remaining two sensors. The following equation gives an expression for calculating overall scalar magnitude from three perpendicular scalar magnitudes.

$$|B|=\sqrt{B_x^2+B_y^2+B_z^2}$$

Giant Magnetoresistance is a quantum effect which causes the resistance of certain materials to decrease by 10-80% in the presence of an external magnetic field. Commercial sensors experience a change in resistance of 4-20%. Commercial sensors are fabricated using thin layers of ferromagnetic material (4-6 nm) separated by thin layers of copper (3-5 nm) patterned in strips. In this configuration the resistance of the ferromagnetic layers will change when an external magnetic field is applied. The sensing element is then placed in a Wheatstone Bridge where an output voltage proportional to a change in resistance can be measured.

Nodal analysis can be applied to the above circuit in order to derive an expression for bridge voltage $V_B$, as a function of the resistance of the sensing element, $R_X$. The resulting expression is shown below in the following equation.

$$V_B = \left(\frac{R_x}{R_B + R_x} - \frac{R_2}{R_1 + R_2}\right)V_{OC} \tag{2-3}$$

MiWi P2P is a wireless personal area network (WPAN) protocol based on IEEE 802.15.4 developed by Microchip. MiWi P2P shares many similarities with the more popular ZigBee protocol and is based on the same physical and media access control (MAC) layers defined by IEEE 802.15.4. Both protocols are tailored to low-power and low-data rate applications frequently required by embedded systems. The underlying IEEE 802.15.4 standard defines two types of devices which may join a network, full function devices (FFD) and reduced function devices (RFD). FFDs are poared from the mains and have more extensive message routing capabilities. RFDs may be battery poared and can periodically turn off their radio in order to conserve power. Each network must have at least one FFD which can function as the network coordinator (NC).

The MiWi P2P protocol is not entirely compliant with IEEE 802.15.4 due to differences in the handshaking. Under IEEE 802.15.4 a device undergoes a five step handshaking process after powering on, MiWi P2P simplifies this into a two step process. In addition to the physical and MAC layers defined by IEEE 802.15.4 MiWi P2P defines network, security and application layers. A software stack provided by Microchip handles the interactions with these layers.

MiWi P2P uses a direct-sequence spread spectrum (DSSS) modulation technique to transmit data. The technique multiplies the data with a pseudorandom sequence before transmission. This can support data transmission rates of up to 250 kbps although typical data rates may be closer to 25 kbps. MiWi P2P currently operates in the 2.4 GHz ISM band with 16 channels each with a bandwidth of 2 MHz.

In a mixed-signal system an analog signal will typically be sampled and processed in the digital side. The digital signal in some cases may be later converted back to an analog signal. In either case the signals must be band-limited otherwise aliasing will occur. Aliasing is an effect in the sampled signal that makes certain signal frequencies indistinguishable from one another.

Consider an analog signal with bandwidth B, in order to have an accurate representation of the analog signal in the digital domain the Nyquist sampling theorem states we must sample the signal at twice the bandwidth. Therefore, the sampling frequency Fs must satisfy the Equation 2-4.

$$Fs >\geq 2B$$

The above equation states that as long as we sample greater than twice the signal bandwidth we can reconstruct the signal with no aliasing. As soon as we sample at under the Nyquist rate aliasing can occur.

Anti-aliasing filters can be either low-pass or band-pass. Practically, the filter is designed with a sharp cut-off to limit aliasing to a minimum. Oversampling can reduce the effect of a small residual signal remaining out of the pass-band.

In a digital or analog system a regulated power supply is often necessary. Two methods exist to convert an input voltage; which can be noisy and varying over some specified range; to the desired output voltage; which is constant to varying degrees of accuracy.

The first method uses a linear conversion. An input voltage which must be higher than the desired output voltage is converted basically by dissipating the excess energy from the input voltage. Best case efficiency for such a regulator is shown in the Equation.

$$\eta = \frac{Vout}{Vin}$$

The second method uses a non-linear conversion. This method is commonly known as a switching regulator or DC-DC converter. The switching regulator converts an input voltage to an output voltage by temporarily storing the input voltage energy and later releasing the energy at a different voltage. Efficiency for such a conversion can range from 75% to 98%.

Several topologies are available for switch-mode DC-DC converters but the scope of the project will limit discussion to the charge pump DC-DC converter. Charge pumps operate with capacitors as the energy storage element. Capacitors are arranged in various topologies combined with a controller and can be charged at one voltage and discharged at another.

The following contains the quantitative requirements this project is intended to meet. The rationale behind requirements is also covered when applicable.

The Sensor Node battery life requirement is established to be two weeks with the help of the project's advisors. If the Sensor Node battery can consistently last at least two weeks then battery replacement can be placed on a schedule. This battery life requirement assumes that the system is always in standby or an active runtime mode and is never switched off.

Two separate communication range requirements are developed for this project. First, communication between the Sensor Nodes and Base Station should be possible at distances of at least 12.5 meters. Secondly, communication should be possible between any two points in an IMRIS operating room. It is important to note that the interior of each operating room is entirely lined with metal and any microwaves within the room will experience numerous reflections.

Each Sensor Node should be able to send collected magnetic field data to the Base Station at least once per second. The requirement takes into account the fact that the MRI system will enter the room no faster than 6.4 cm/s and the Sensor Nodes are battery powered.

The system wake up time is the time between the Base Station being told it should wake up the system and all nodes reporting their first magnetic field measurement. This requirement is established to be 10 seconds. The 10 seconds is less than the amount of time it takes the magnet doors to open which allows the MRI system to enter the room. This ensures that magnetic field is being actively monitored at all times while the MRI system is in the operating room.

Each Sensor Node should be able to detect when magnetic field surpasses two separate safety thresholds. First, a warning threshold at 10 G indicates that a dangerous situation could be developing. A second threshold at 50 G indicates that a hazard has been detected and action such as stopping the magnet should be taken. These thresholds are based on the current gauss line system. The first threshold is increased to 10 G from 5 G when it is learned that many objects such as lighting booms would always be exposed to fields greater than 5G. The 5 gauss line is present in current IMRIS operating rooms as a warning to people with pacemakers. Since the Sensor Nodes are not intended to be attached to people increasing the first threshold does not compromise safety.

The requirement for sensor magnitude accuracy is established to be within the greater of two gauss or ten percent per sensing axis. The goal of this project is not to produce a precision instrument and instead is interested in detecting approximate safety thresholds. This requirement also takes into account the available sensors and the fact that the current gauss line system is only valid for certain elevations in the operating room.

In order to detect the two thresholds listed in section 3.5 the sensors selected are required to have a sensing range between at least 5 G and 60 G.

During operation each Sensor Node may be exposed to magnetic fields greater than 50 G. If the Sensor Node cannot function in a magnetic field stronger than 50 G than it cannot produce a warning when the second safety threshold is exceeded and the system will fail. It is established that the Sensor Node should continue to function in magnetic fields of at least 200 G.

The Sensor Node should be small enough to attach to a variety of objects found in an operating room. The project's advisors also recognized that this is a student project and further miniaturization could occur after the proof of concept system is developed. Taking the above into account a Sensor Node size requirement of 3"W×3"L×2"H is established. Imperial units are used due their prevalence in PCB manufacturing.

The system level design is the result of several discussions between the group's members and project advisors. For the purposes of system level design each system component is treated as a black box with inputs and outputs which can be interfaced to other system components.

The User Interface is responsible for displaying a visual representation of the data received from the Base Station. Data comes in via an RS-232 communications cable and is read one message/line at a time. Each message contains a code which indicates what the message represents and then any relevant data appended to the end of the message. Incoming sensor readings are graphed and logged to give the user a visual representation of the entire system.

The Base Station contains two separate interfaces. The first interface connects to the user interface and the second connects to each of the Sensor Nodes. The main components in the Base Station are shown in FIG. 4.

The power supply converts and regulates the input voltage to something the other components can tolerate. The wireless link provides a connection between the Base Station and each of its associated Sensor Nodes. Simple status messages are shown on the character LCD screen which is mainly used only for diagnosis purposes. The RS-232 interface provides a bi-directional link between the User Interface and the Base Station. Almost every message received from the Sensor Nodes is relayed to the User Interface through the RS-232 connection.

Figure 5:
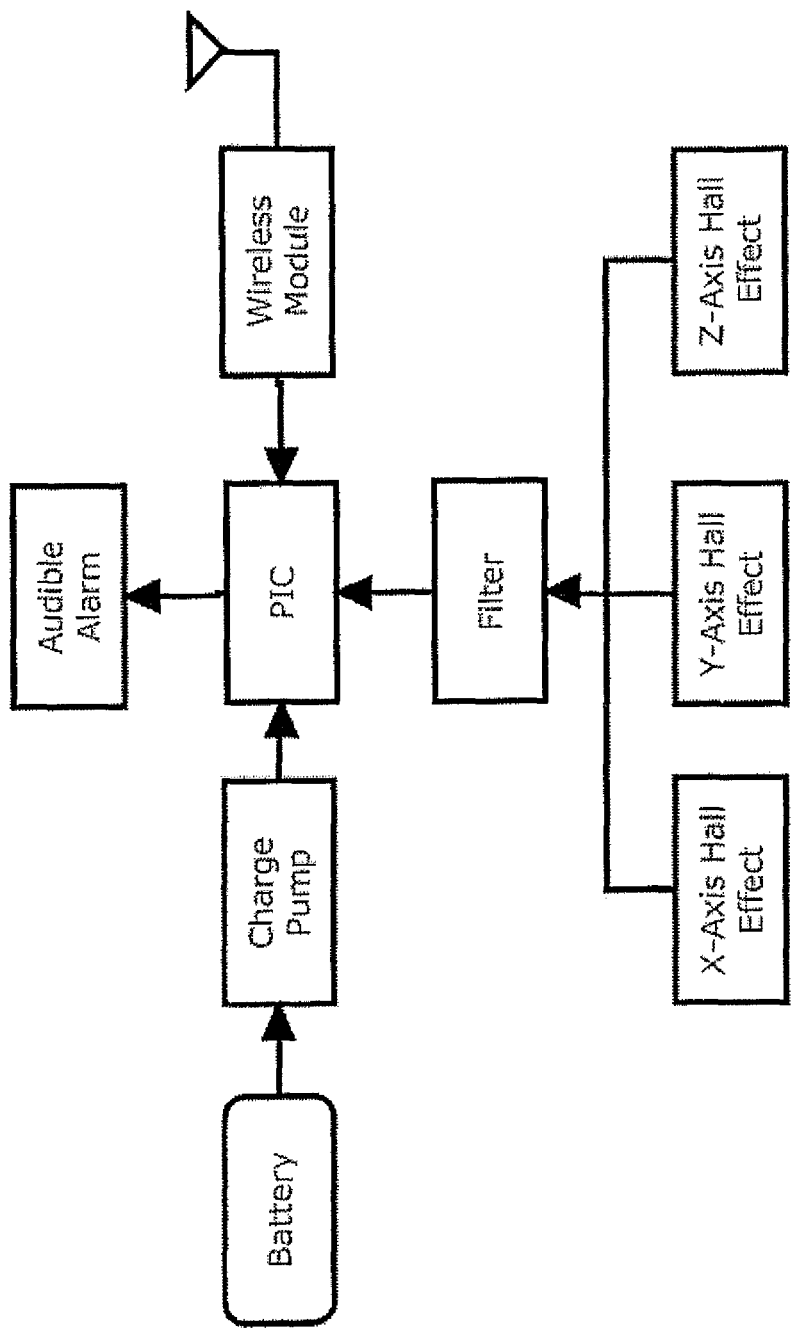
FIG. 5 illustrates the components in the Sensor Node.

Each Sensor Node's main purpose is to measure magnetic flux density at the nodes current position and relay this information back to the Base Station. The wireless link provides a communication link between the Sensor Node and the Base Station. The Sensor Node is also responsible for outputting an audible alarm when a certain magnetic flux density threshold is passed. FIG. 5 illustrates the components in the Sensor Node.

Once the Base Station is powered up it immediately searches for an appropriate channel on the 2.4 GHz ISM band to operate on. When the channel has been chosen the Base Station enters the main runtime mode of the system. In this state, the Base Station actively listens for incoming connections and sensor data from any nodes already connected.

Each new node that is being powered up will start searching for the Base Station channel and attempt to connect. This initial discovery process only has to be done once since the Base Station will never switch channels unless it has been rebooted in which case the Node will detect a loss of connection and rescan for the Base Station.

Once a Sensor Node is connected and the Base Station is operating in the main runtime mode the Sensor Node will; take a sensor reading, transmit the reading, go to sleep, wake up, read an acknowledgment from the Base Station and repeat the process at least once a second. The sleep portion of the cycle allows the Sensor Node to conserve precious battery power while it waits to take the next reading The Base Station can change states based on a single logic input which is interfaced to the sliding door of the magnet room. If this door is open the Base Station will remain in the main runtime mode. Once the door is closed it is assumed either a scan is in progress or the magnet is no longer in the room and the Base Station can enter a low-power standby mode. Each Sensor Node is initially un-aware of the change until sending another sensor reading. Instead of receiving an acknowledgement the Sensor Node will receive a go to sleep command. The Sensor Node will then subsequently also enter a low-power standby mode and change its operating cycle. The Sensor Node will wake up, check for any new messages and go back to sleep for approximately five seconds. The on-time of the Sensor Node in the low-power state is significantly shorter than runtime mode and the average power is drastically reduced. The Base Station can wake the Sensor Nodes back up by sending a corresponding wake-up signal to the Sensor Nodes. Once the wake-up signal is received the Sensor Nodes will operate again in the runtime mode and this process repeats each time the magnet is brought in or out of the room.

The following describes the hardware and software used to realize the Base Station. The Base Station is responsible for communicating with each Sensor Node and relaying certain information to the User Interface. Switching between standby mode and runtime mode is also coordinated through the Base Station.

Figure 6:
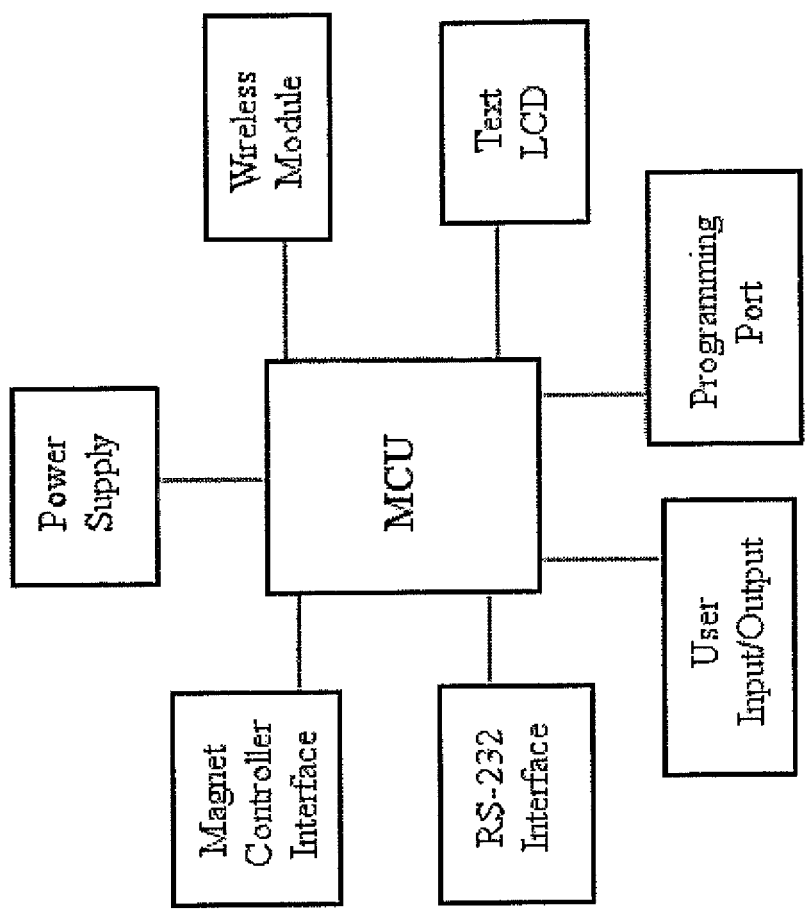
FIG. 6 shows the microcontroller which is the center of the Base Station architecture.

At the center of the Base Station architecture is the microcontroller shown in FIG. 6. All the other components of the system are interfaced to the microcontroller.

The following sections describe reasoning behind each component selection and any related design formulae.

The Base Station is not required to be powered by batteries and so the decision is made to use a wall transformer (wall-wart) and a linear regulator to convert the transformer output to a voltage the system could use. A system voltage of 3.3 V is chosen to give a balance between power consumption, the availability of parts and hardware compatibility with the Sensor Node.

The LD1117A linear regulator is chosen from STMicroelectronics which can operate with an input voltage of 4.75 V-10 V. This regulator can supply up to 1A of current which exceeds estimates of approximately ~228 mA for the Base Station. Current consumption estimates are included in the following sections for each piece of hardware.

The power plug is a barrel jack used to connect the wall-wart to the Base Station. SW1 is a slide switch used to turn the Base Station on or off. C1 is chosen based off the LD1117A datasheet to provide input filtering for the regulator. C2 is chosen for output filtering and stability of the LD1117A also based off the datasheet.

Microchip's PIC18F series of microcontrollers are immediately high on the list of options due to the group's familiarity with them. Decision is made to select the microcontroller such that it would satisfy requirements of both the Base Station and Sensor Node to simplify later integration. The list of requirements for the microcontroller is as follows.

At least 3 analog inputs

Enough digital I/O for interfacing to the LCD, backlight control, wireless module, LEDs and buttons on the Base Station. The Sensor Node has a few other modules to interface too but will be discussed in chapter 6.

Hardware SPI module for interfacing to the wireless module

Fast sleep and wake-up

The PIC18F26K20 met all the requirements for both Base Station and Sensor Node.

As stated earlier, the microcontroller is at the center of the Base Station architecture and needs to interface to all the other components.

Certain status messages can be shown on a LCD mounted directly over top of the Base Station. The LCD serves mostly as a diagnostic tool rather than a display during standard usage. Requirements for the Base Station are as follows:

1) LCD logic must be powered from 3.3V for interfacing to the existing power supply
2) LCD backlight must also be powered from 3.3V
3) LCD controller must support 4-bit communication due to our limited number of I/O on the microcontroller
4) LCD must support 4 lines×20 characters on the display An LCD from Newhaven Display Intl (NHD-0420H1Z-FL-GBW-3V3) satisfies all the requirements and available through Digikey.

The wireless module (MRF24J40MA) is chosen since it can support several standard communication protocols which are included in the IEEE 802.15.4 standard. Among the supported protocols are ZigBee and MiWi P2P which are particularly useful for the project's application since they support low data rate and low power communications. The MRF24J40MA operates in the 2.4 GHz ISM band and transmits up to a maximum of 0 dBm. Software and several application notes are provided from Microchip to ease development using the module. Initial testing is done on the PICDEM Z demonstration board from Microchip which gave some familiarity with the software before moving onto an actual prototype.

Interface between the microcontroller and wireless module requires no special considerations. Communication is performed using a Serial Peripheral Interface bus (SPI bus) along with several control lines.

Figure 7:
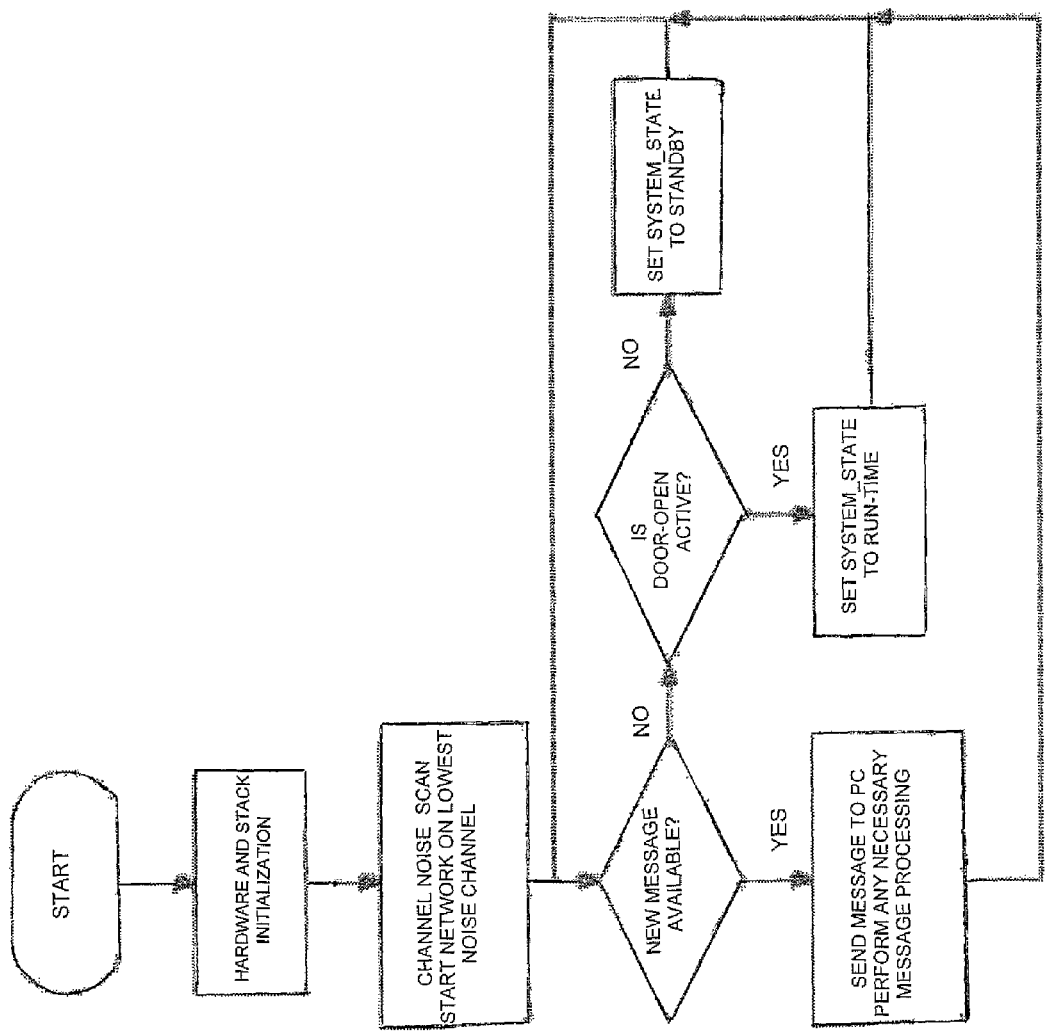
FIG. 7 shows a simplified flow chart of the Base Station software.
Figure 8:
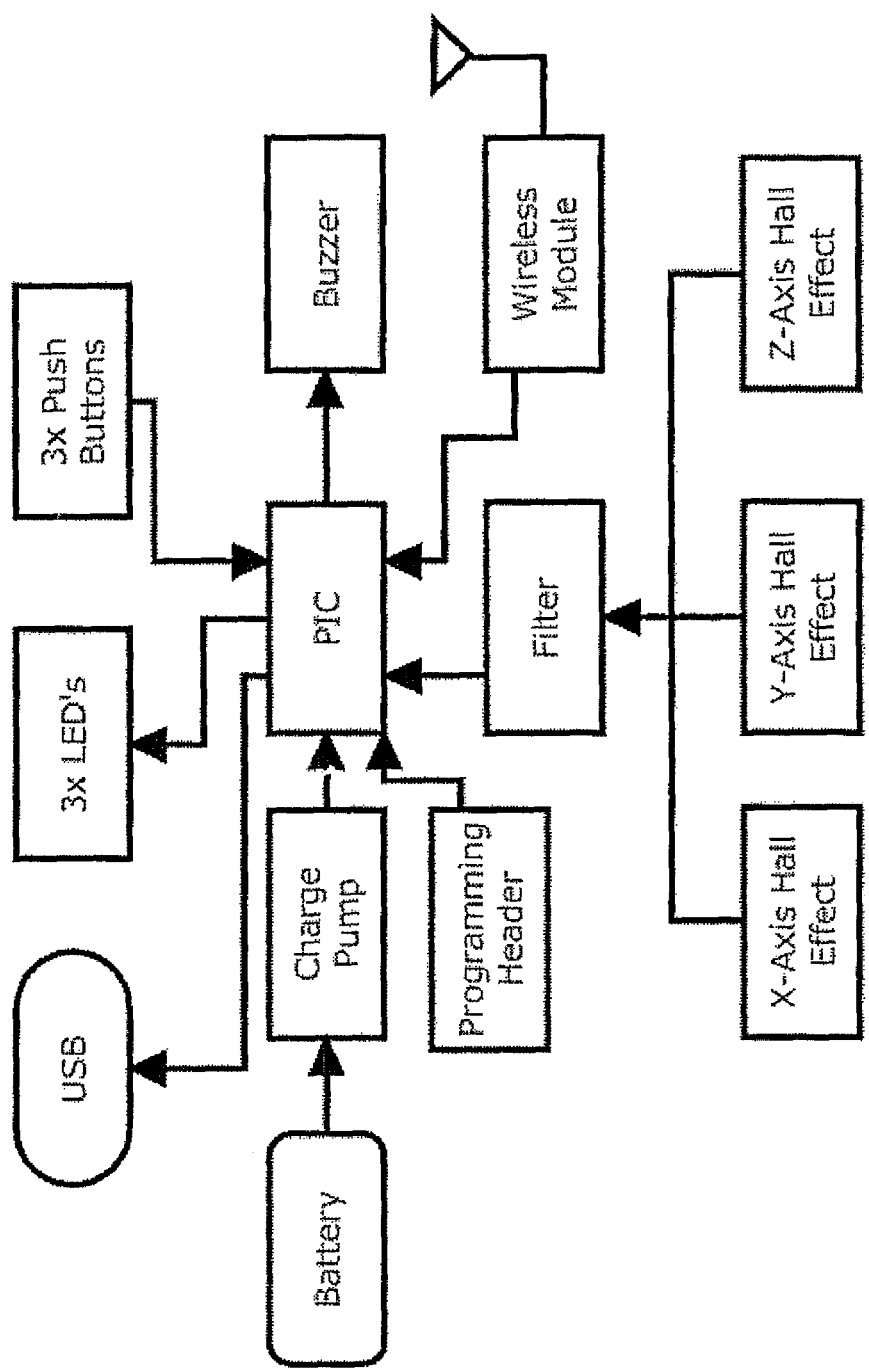
FIG. 8 is a block diagram of the sensor node.

Base Station software design can be kept as simple as possible. Initial design included a reduced feature stack of ZigBee but due to microcontroller program memory limitations the choice is made to move to an even smaller stack using Microchip's MiWi P2P stack. MiWi P2P can support a star network and basic bi-directional communication which is what is needed for the project. No hardware redesign is needed since the same physical layer for both stacks can be used. FIG. 7 shows a simplified flow chart of the Base Station software.

The Base Station begins by initializing all the hardware peripherals such as wireless module and EUSART for communicating with the user interface. Following initialization a noise scan is performed in the 2.4 GHz band to determine the most appropriate channel to start the network on. Once a suitable channel is found the Base Station begins listening for new Sensor Nodes requesting to join and enters the main loop of the software.

Each loop begins by checking for new wireless messages as this is a high priority task since a message can be discarded if it's not responded to quickly enough. If there is a new message any necessary processing is performed such as sending out an acknowledgement to a Sensor Node after receiving a sensor reading. If no new messages are available then the Base Station is free to perform other tasks, one of which is checking the DOOR_OPEN signal. If the DOOR_OPEN signal is asserted the Base Station responds by waking up any Sensor Nodes that are in standby and begin taking readings. Once the DOOR_OPEN is no longer asserted the Base Station puts all the Sensor Nodes back into standby to preserve battery life.

In order to keep the entire system robust several sub-systems are needed to monitor activity in the network and ensure all the Sensor Nodes are communicating as expected. For example, during runtime mode the Base Station expects a new sensor reading at least once per second. If a new reading is not received every second then the Base Station will conclude the Sensor Node has both been turned off and disconnected from the network or some other problem with the Sensor Node is preventing it from functioning properly. In either case, the Base Station reports the Sensor Node as being disconnected and further action from the operator can be taken. During standby, very limited communication is taking place but the Base Station still needs to be aware of which Sensor Nodes are still connected. Every few minutes the Base Station will send out a ping and expect an acknowledgment from the Sensor Node. If the Sensor Node fails to return the acknowledgment then the Base Station again assumes something is wrong with the Sensor Node and reports to the operator that it has been disconnected.

In order to measure the magnetic flux density near all large ferrous objects in the imaging suite a small battery powered Sensor Node needs to be built. The Sensor Node is a custom designed PCB which will have a 3 axis sensor to return gauss readings. An 802.15.4 wireless transceiver will also be used in order to connect the Sensor Node to the Base Station. The sensor will then need to communicate with the Base Station to receive messages and send data to the Base Station. While between communication sessions the sensor will also be taking magnetic flux density readings and readings of the amount of battery life remaining.

There are numerous steps during the process of coming to a final design of what would become our Sensor Node. The first hurdle to overcome is to choose a sensor by designing some preliminary hardware. This is accomplished using a sensor evaluation board design and constructed as part of this project. After the design of the sensor evaluation board a redesign took place to include a few extra components and the wireless aspect required by the Sensor Node. Finally, software is written, tested and debugged on the Sensor Node to bring us to the final product.

The low-pass anti-aliasing filters are being implemented to limit the bandwidth of the analog signal so that aliasing did not occur in the analog-to-digital conversion process. An additional advantage to the anti aliasing filters is that they limit the noise bandwidth of the signal being filtered. The filters are fabricated on separate breakout boards to prepare for the possibility that the filters may need to be redesigned. Also located on the sensor evaluation board is a socket to connect a EUSART to USB for debugging and output purposes. The evaluation board is controlled by a PIC microcontroller and had the option of having two separate power supplies. The power is supplied by either an axial lithium ion battery fed through a charge pump or alternatively by a 3.3V to 10V DC power supply fed through a linear voltage regulator. Also on the sensor evaluation board are two, two pin, jumpers which allow either or both of the sensors to be activated.

Anti-aliasing filter design began by investigating the merits of each type of frequency response. The pass band response is of most concern. The frequency response of the filter needed to be flat in the pass band as to not obscure any data measurements. The response in the stop band is less of a concern. Since the project is only interested in the magnitude of the sensor output we can ignore phase response of the filter.

The two suitable implementations found are Butterworth response or Inverse Chebyshev response. Both satisfy the requirements outlined earlier. Calculating the required order of the filter is done using the following equation and then rounded up to the next integer.

$$n \geq c_1 \frac{\ln[c_2 \delta / \varepsilon]}{\ln[c_3]}$$

Attenuation constants $\delta$ and $\varepsilon$ are calculated using equations below.

$$\delta = \sqrt{10^{(A_s/10)} - 1}$$

$$\varepsilon = \sqrt{10^{(A_p/10)} - 1}$$

$A_s$ and $A_p$ are the specified attenuation in dB for the stop-band and pass-band for the filter. The constants $c_1$, $c_2$ and $c_3$ depend on the type of filter Frequencies $\omega_s$ and $\omega_c$ are the stop-band frequency and cut-off frequency respectively. Determining appropriate specifications for the anti-aliasing filter are chosen with the following criteria.

1) Each sensor will be sampled at a rate of at least 100 times per second. The magnetic field generated by an MRI is near static and therefore high sampling rate is not necessary.
2) Assuming Gaussian white noise on the output of the sensing element the noise bandwidth needs to be limited such that the peak voltage of noise does not exceed the specification of 1 gauss error in the measurement.

Unfortunately the Hall Effect sensor specifies noise in volts-peak-to-peak at a specific cut-off frequency for an external low pass filter. The A1391 Hall Effect sensor specifies a maximum noise voltage of 12 mVp-p with an external low pass filter at 2 kHz. An error of 6 mV in either direction equates to 7.5 gauss (1.25 mV/G sensitivity) uncertainty in our measurement and therefore noise bandwidth needs to be reduced. An accurate method of determining the rms noise voltage from the peak-to-peak has not been found. An estimate can be made using ⅙ to ⅛ of the peak-to-peak value, not very accurate but it does give some rough numbers to use. The rms noise voltage of the A1391 Hall Effect sensor is then $V_n$=12 mVpp/6=2 mVrms.

$$V_n = \sqrt{4kTRB} \quad (6\text{-}6)$$

$B_c$:Boltzmann constant [J/K]
T:Absolute temperature of the system [K]
R:Equivalent resistance of the noise source [ohms]
B:Bandwidth of the system [Hz]

If we hold temperature and equivalent noise resistance of the system constant and just modify the bandwidth we can solve for a new noise voltage $V_n'$ in terms of a different bandwidth B' shown in equation 6-7.

$$V_n' = V_n\sqrt{B'/B} \quad (6\text{-}7)$$

As stated earlier the magnetic field being measured is near static. By limiting the bandwidth to 10 Hz, the rms noise voltage is calculated to be $V_n'$=141 µVrms. Using the same approximation from peak-to-peak to rms an estimate of the max error due to noise can be found. $V_{n,pp}$=6*$V_n'$=849 µVpp. The peak noise voltage gives an error of 0.5 gauss in either direction which satisfies the requirement to measure with a precision of 1 gauss.

Choosing the stop-band attenuation is selected to give a sharp cut-off but also keep the part count to a reasonable number. Oversampling the output of the filter relaxes constraints on the stop band attenuation since oversampling effectively moves the Nyquist frequency to half of the actual sampling rate and therefore increases the effectiveness of the filter. Choosing stop-band attenuation directly relates to the required order of filter from equation 6-1 and therefore a guess-and-check method is employed to aim for a specified filter order. In order to keep the overall construction small and simple active filters are employed for the design. Microchip offers a free design tool which is used in the actually implementation of the filter design.

The charge pump used on the sensor evaluation board is the MCP1256, designed by Microchip. The charge pump is a DC/DC converter which can take an input of 1.8V-3.6V DC and output 3.3V DC with minimal ripple. This particular charge pump is chosen as it had a low output voltage ripple of 20 mV peak-peak at 100 mA output current, as well as a sleep current of 20 uA. The sleep current is important to us as the Sensor Node is a battery powered device. The layout for the charge pump and attached passive components are chosen as per the data sheets recommendation.

The battery is the TL-5955, an axial lithium ion battery manufactured by Tadiran. This battery has an output voltage rated at 3.6 V with a capacity of 1.5 Ah. As the Sensor Nodes will be in an operating room environment the large capacity yet still relatively small size, as seen in FIG. 6-4 is why this battery is chosen. The battery is also able to maintain capacity at current ratings of up to and beyond 10 mA.

This component is used only to allow for ease of testing. Instead of using and draining the battery the LD1117AV33 linear voltage regulator will allow us to use up to 10V of DC to supply the circuit. A design oversight resulted in a switch not being placed between the output of the linear voltage regulator and the charge pump. This is fixed by cutting the trace to the output of the charge pump so as to not need to repeatedly unsolder it and placed a jumper wire in if needed.

Sensor selection can use two options. Allegro's A1391 Hall Effect sensors or NVE Corporations Giant Magnetoresistive (GMR) sensors. The Hall Effects are chosen for their low active current draw of 3.2 mA along with a sleep current of only 25 uA. Additionally, the Hall Effect sensors could also give readings from 1 to 1320 Gauss covering the range of 5 to 60 gauss that is needed. The GMR sensors are selected for their ability to operate in a linear range covering our design specifications. Depending on the sensor chosen the linear range could be any of 1.5 to 10, 5 to 35 or 10 to 70 gauss. As can be seen in FIG. 6-4 there is 3 of each sensor. This is so that all three axes of the magnetic field could be measured. As the GMR's axis of sensitivity is along the length of the chip we needed two chips at 90 degrees to each other and a third placed vertically using another small PCB. The Hall Effects axis of sensitivity is through chip and therefore we created two vertical boards at 90 degrees to each other and then a third chip on the main PCB.

The schematic layout as well as board layout is created within Eagle CAD and exported to Gerber files using the Eagle CAM processor. The PCB is then fabricated using the mill in Dr. Bridges RF lab. The PCB is milled from a ¹⁄₁₆" thick double sided piece of copper clad with an FR-4 dielectric.

Software for the sensor evaluation board can be written in C using Microchip's MPLAB editor. As can be seen in the flowchart shown in FIG. 6-6, the main flow of the code is simply to take a reading from each sensor, output the data, and then repeat. Test code is also written to determine the amount of time it takes for a Hall Effect to come fully out of sleep mode. The Hall Effect sensors are specified to take 60 microseconds to reach 90% of their maximum output when coming out of sleep. Through experimentation it is found that this took at least 3 milliseconds, for the sensors to wake up. To provide a margin of safety a 10 millisecond wait is used to between activating a sensor and taking readings. Since the Sensor Node code is built off of the sensor evaluation code further clarification of the code can be found in section 6.2.12 Sensor Node Software.

The hardware has the following functionality:
Battery powered
Wireless Communication using the MiWi P2P protocol
Battery Meter
Buttons and LED's for debugging
EUSART to USB for debugging
Programming header
Sense field in three axis
PIC to control the circuit
Buzzer activated at greater than 50 Gauss
Power Switch The microcontroller used on both versions of the sensor board is the PIC18F26K20, this microcontroller has many advantages for our application. The first is that it is part of Microchip's XLP or extremely low power family which reduces power draw from the battery. The PIC which is chosen is also quite small measuring only 17.9×10.3 mm including pins. The number of I/O pins is also sufficient for our needs having an extra 6 pins which are used for the LED's and push buttons. Finally Microchip supplies an extensive C library for the PIC18 family known as the C18 library. This aided the software design greatly by allowing us to focus more on functionality than the intricacies of the PIC itself.

The Hall Effects are chosen because of the results of the testing with the sensor µevaluation board. They are directly connected to the PIC by means of their sleep pins and indirectly by means of the filter output. The way this works is that only one sensor (x, y or z) is active at a time and the others are put in a high impedance state. This way each sensors output can be tied to the input of the filter without being concerned about conflicting signals.

The single update to the Hall Effects since the sensor evaluation board is by means of the two vertical boards. They have been redesigned to be smaller and more mechanically rigid. This has been accomplished by connecting the two together by means of interlocking cut outs. Along with being more rigid this configuration forces the sensors to be at 90 degrees creating a true 3 axis sensor when combined with the third sensor mounted on the main Sensor Node PCB.

The wireless transceiver is Microchip's MRF24J40MA and is used as a radio to communicate with the Base Station. Further clarification can be found in the Base Station section of the report, specifically 5.1.4.

The buzzer chosen is the CMI-1240 from CUI Inc. The buzzer's only purpose is to turn on if a given threshold is passed in our tests that threshold is 50 gauss and can easily be changed to any other number. The buzzer is switched on by means of an NPN transistor operating in saturation. The schematic can be seen below in FIG. 6-9. R11 is chosen as 1M ohm only to serve as a pull down on start up. The 57.6K ohm resistor is chosen to bias the diode and is solved for using $\beta=110$ and a collector current ($i_C$) of 5 mA. Using equations 6-8 and 6-9, base current ($i_b$) is found to be 45 µA; next solving for R11 will result in 57.6K ohms.

When the Sensor Node is poared on its first task is to initialize the PIC and MiWi stack. The Sensor Node then scans the channels on the 2.4 GHz ISM band to locate the Base Station network. If the Base Station is found the program continues on, otherwise the node continues to scan the channels to find the network. Once the network is found and a connection is established the Sensor Nodes next task is to calibrate its Hall Effect sensors.

Calibration is achieved in a zero gauss (ignoring the earth's magnetic field) environment and is accomplished by taking 1000 readings of each sensor and taking the average of this value. A unique offset for each sensor is then written to memory and stored for the remainder of the session. The offset is chosen to ensure that the sensor reads zero when experiencing zero gauss.

The sensor next checks to see if a message has been received from the Base Station. If so, the flow takes one of two branches depending on if the sensor is in runtime mode or standby mode. If in standby the sensor node will either respond with a connectivity acknowledgment or come out of standby mode. If in runtime mode the code will either respond with a connectivity acknowledgment or enter standby mode. When transitioning from standby to runtime or vice versa, the code sets a flag to indicate which state it is in and then changes the amount of time the node should sleep for. If in standby the sleep is set to approximately 5 seconds and approximately 600 milliseconds for runtime mode.

Now that the received message is dealt with the branched flow connects up with where the code would be if no message is received at all. At this stage the code again checks for which state the node is in, either runtime or standby. If in runtime the sensor now takes a measurement from the sensor. This is done in an identical manner to the sensor evaluation code shown in section 6.1.7. The measurements are read in through the PIC's analog to digital converter and oversampled. The oversampling takes 100 readings from each sensor and averages each individual sensor reading to give a final voltage. This voltage is then converted to a gauss value by using equation 6-10. In this formula $V_{meas}$ is the average voltage, $V_{ref}$ is the offset chosen by the calibration, and 1.25 mV/G is the linear conversion from voltage to gauss for the Hall Effect sensors.

$$\text{Gauss Value} = \frac{(V_{meas} - V_{ref})}{1} \cdot 25$$

After calculating the gauss value of all three sensors the magnitude is calculated using equation 6-11.

$$|B| = \sqrt{B_x^2 + B_y^2 + B_z^2}$$

At this point if the magnitude surpasses 50 gauss the audible buzzer is sounded and when the value drops below 50 gauss the buzzer is turned off. The gauss value recorded from each axis and the magnitude are now wirelessly sent to the Base Station. After sending the data and a ping to the Base Station for connectivity, the program checks to see if any buttons are being pressed. If so, one of three functions is executed depending on which button is pressed. It should be noted that as these buttons do not trigger an interrupt they need to be held down for 1-5 seconds depending on the state of the node. After completing any requests from a push button the Sensor Node enters a low power sleep mode for a duration set by the state of the Sensor Node.

Subsystem uses the python programming language running on a PC. The Human Interface software must accomplish a variety of tasks, reading in data from the Base Station, displaying this data in a meaningful way to the user and logging this data for further analysis. The software must accomplish these things while being easy to use, free from error and visually pleasing to the user. First, the program must open a serial port for communication and initialize several objects. Next, the program collects data from the serial port and uses this data to update text files, display warnings and update graphs in real time.

The input to the program consists of commands sent from the Base Station's EUSART to the PC's serial port.

As this system is to be located in an operating room environment full of many instruments and tools, it would be best to have the Sensor Nodes small and out of the way. Miniaturizing the Sensor Node is a area which could be investigated in the future. Smaller parts could be sourced, especially items such as the buzzer and batteries. On a final product the LED's and buttons could also be taken off the PCB layout as they are only for debugging purposes and removing them will help to shrink the physical size of the Sensor Node while extending battery life. Component density can be improved by re-routing the PCB for a four layer board.

Sensor accuracy can be improved numerous ways such as; taking greater care when routing signal lines, sourcing a DC-DC converter with less ripple, adding a linear regulator or employing more sophisticated digital filtering techniques. In the future more accurate Hall Effect sensors could be available.

Battery life can be increased through software optimization, reducing transmission power or through emerging energy harvesting techniques. The system can support more sensor nodes in the future by switching to a microcontroller with more RAM. A graphical LCD on the Base Station can also provide more meaningful visual feedback than a text LCD. The Human Interface can also be greatly enhanced by allowing for parameters on the Sensor Nodes to be changed such as warning thresholds and measurement duty cycles. This project has been selected for continuation by IMRIS meaning many of the possibilities mentioned in this chapter could become a reality.

The arrangement described provides a magnetic field monitoring system consisting of three Sensor Nodes, a Base Station and a Human Interface which can detect and prevent hazards associated with inter-operative MRI. The system prevents hazards by using three Sensor Nodes to monitor magnetic flux density and to sound an audible alarm if safety thresholds are exceeded. The Sensor Nodes then send the collected data wirelessly using the MiWi P2P protocol to a Base Station which can prevent the MRI system from moving further into the operating room. The Base Station also sends the data to a Human Interface which can log the data, warn the user and display the data in an immediately comprehensible manner. The hardware design of the project utilized PCBs and surface mount technology to minimize size and power consumption. Difficulties encountered such as switching from the ZigBee protocol over to the MiWi P2P protocol did not prevent the project from meeting all of the design specifications. The fact that this project has met all of its specifications and has been selected for continuation by IMRIS, the project's industrial sponsor, demonstrate the success of this project.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. An apparatus configured for safely carrying out medical procedures including at least one magnetic resonance imaging procedure on a patient comprising:
    an MR imaging room;
    a magnetic resonance imaging apparatus including a movable magnet that is arranged to be located in the magnetic resonance imaging room and configured for generating a magnetic field of sufficient intensity in order to carry out a magnetic resonance imaging procedure on the patient while the patient is in the MR imaging room;
    a plurality of additional components configured for use in carrying out at least one additional procedure on the patient;
    wherein the magnetic field of the magnet extends to an area within the room outside of the magnet with a sufficient intensity that causes movement of ferro-magnetic material within the area, outside of the magnet into which the magnetic field of the magnet extends;
    the magnet and/or the plurality of additional components being mounted and configured for relative movement with respect to one another whereby the magnetic resonance imaging procedure is carried out with the plurality of additional components in a remote location from the magnet and the at least one additional procedure is carried out with the magnet in a remote location from the plurality of additional components;
    a control system configured for controlling the relative movement of the magnet and the plurality of additional components;
    a plurality of magnetic field sensors each mounted on a respective one of the plurality of additional components, and configured for measuring the magnetic field of the magnet at the location of the respective one of the components onto which a respective one of the magnetic field sensors is mounted; the magnetic field sensors each being arranged in order to provide a communication of signals with the control system;
    the control system being arranged to change operation of the relative movement of the movable magnet and/or the plurality of additional components in response to the receipt of a communicated signal from one or more of the magnetic field sensors which are mounted onto the plurality of additional components;
    whereby the control system uses the sensed magnetic field strength from the plurality of magnetic field sensors, which are mounted onto the plurality of additional components in order to avoid collisions during movements of the movable magnet, or movement of the plurality of additional components within the imaging room.

2. The apparatus according to claim 1 wherein each sensor mounted on one of the plurality of additional components measures the magnetic field strength in 3 perpendicular dimensions.

3. The apparatus according to claim 1 wherein the magnetic field sensors are mounted on both mobile and stationary objects, comprising booms, a surgical table, microscopes, instrument trays, kick buckets, foot pedals within the MR imaging room.

4. The apparatus according to claim 1 wherein the magnetic field sensors communicate by wireless communication from their respective mounted locations on the plurality of additional components back to the control system.

5. The apparatus according to claim 1 wherein the control system includes an audio/visual display.

6. The apparatus according to claim 1 wherein the control system includes a real-time asset tracking system of the plurality of additional components and the movable magnet.

7. The apparatus according to claim 1 wherein the control system is arranged in order to initiate movement of the magnet and the plurality of additional components from a potentially unsafe position to a pre-defined safe-position.

8. The apparatus according to claim 1 wherein the control system also comprises object avoidance mechanisms, as a safety feature, in order to avoid collision with persons and other objects in the MR imaging room.

9. The apparatus according to claim 1 wherein the magnet is movable and the control system is arranged in order to estimate a position of the magnet from the sensed field strengths from the set of magnetic field sensors.

10. The apparatus according to claim 9 wherein the control system is arranged in order to use information on the estimated position of the magnet in combination with the sensed magnetic field strength from the set of magnetic field sensors in order to anticipate collisions and initiate avoidance mechanisms.

11. The apparatus according to claim 1 wherein the control system is arranged to include a known position of a respective magnetic field sensor located on a respective one additional component of the plurality of additional components and a physical model of a shape of the component in order to provide a decision based on the current orientation of the respective additional component and the sensed field strength.

12. The apparatus according to claim 1 wherein there is provided at least one of the additional components in the room which does not have a respective one of the magnetic field sensors attached thereto, and there is also provided a system configured for communicating a position of said at least one of the plurality of additional components to the control system.

13. The apparatus according to claim 12 wherein said at least one of the plurality of additional components, is fixed.

14. The apparatus according to claim 12 wherein said system for communicating a position of said at least one of the additional components comprises a camera system.

15. The apparatus according to claim 1 wherein the control system is arranged in order to achieve an optimal configuration of the plurality of additional components in order to conduct a magnetic resonance imaging.

16. The apparatus according to claim 1 wherein the control system is arranged and configured to shut off RF noisy equipment before performing magnetic resonance image imaging.

17. Apparatus carrying out medical procedures including at least one magnetic resonance imaging procedure on a patient comprising:
- an MR imaging room;
- a patient support table within the MR imaging room
- a magnetic resonance imaging apparatus including a movable magnet arranged to be located in the MR imaging room and configured for generating a magnetic field of sufficient intensity in order to carry out a magnetic resonance imaging procedure on the patient while the patient is in the room;
- a plurality of additional components on configured for use in carrying out at least one additional procedure on the patient, the additional components being located in the MR imaging room at positions spaced away from the movable magnet;
- wherein the magnetic field of the magnet extends to an area within the room outside of the magnet with a sufficient intensity that causes movement of ferro-magnetic material within the area, outside of the magnet into which the magnetic field of the magnet extents;
- the magnet and/or the plurality of additional components being mounted and configured for relative movement with respect to the patient support table from a first position of the magnetic resonance imaging procedure on the patient to a second remote position configured for carrying out said at least one additional procedure on the patient;
- a control system configured for controlling the relative movement of the magnet and the plurality of additional components;
- a plurality of magnetic field sensors each mounted on a respective one of the plurality of additional components, and configured for measuring the magnetic field of the magnet at the location of the respective one of the components onto which a respective one of the magnetic field sensors is mounted; the magnetic field sensors each being arranged in order to provide a communication of signals with the control system;
- the control system being arranged to change operation of the relative movement of the movable magnet and/or the plurality of additional components in response to the receipt of a communicated signal from one or more of the magnetic field sensors which are mounted onto the plurality of additional components;
- whereby the control system uses the sensed magnetic field strength from the plurality of magnetic field sensors, which are mounted onto the plurality of additional components in order to avoid collisions during movements of the movable magnet, or movement of the plurality of additional components within the imaging room.

18. The apparatus according to claim 17 wherein the control system is arranged in order to stop movement of the magnet.

19. Apparatus configured for safely carrying out medical procedures including at least one magnetic resonance imaging procedure on a patient comprising:
- an MR imaging room;
- a magnetic resonance imaging apparatus including a movable magnet that is arranged to be located in the magnetic resonance imaging room and configured for generating a magnetic field of sufficient intensity in order to carry out a magnetic resonance imaging procedure on the patient while the patient is in the MR imaging room;
- a plurality of additional components configured for use in carrying out at least one additional procedure on the patient;
- wherein the magnetic field of the magnetic extends to an area within the room outside of the magnet with a sufficient intensity that causes movement of ferro-magnetic material within the area, outside of the magnet into which the magnetic field of the magnet extends; the magnet and/or the plurality of additional components being mounted and configured for relative movement with respect to on another whereby the magnetic resonance imaging procedure is carried out with the plurality of additional components in a remote location from the magnet and the at least one additional procedure is carried out with the magnet in a remote location from the plurality of additional components;
- a control system configured for controlling the relative movement of the magnet and the plurality of additional components;
- a plurality of magnetic field sensors each mounted on a respective one of the plurality of additional components, and configured for measuring the magnetic field of the magnet at the location of the respective one of the components onto which a respective one of the magnetic field sensors is mounted; the magnetic field sensors each being arranged in order to provide a communication of signals with the control system;
- the control system being arranged to change operation of the relative movement of the movable magnet and/or the plurality of additional components in response to the receipt of a communicated signal from one or more of the magnetic field sensors which are mounted onto the plurality of additional components;
- wherein the control system is arranged to estimate relative positions of the movable magnet and/or the plurality of additional components relative to the magnet from the sensed field strengths from the set of sensors which are mounted onto the plurality of additional components;
- whereby the control system uses the sensed magnetic field strength from the plurality of magnetic field sensors, which are mounted onto the plurality of additional components in order to avoid collisions during movements of the movable magnet, or movement of the plurality of additional components within the imaging room.

* * * * *